(12) United States Patent
Todorokihara

(10) Patent No.: US 8,664,933 B2
(45) Date of Patent: Mar. 4, 2014

(54) FREQUENCY MEASURING APPARATUS

(75) Inventor: Masayoshi Todorokihara, Shimosuwa-machi (JP)

(73) Assignee: Seiko Epson Corporation, Tokyo (JP)

(*) Notice: Subject to any disclaimer, the term of this patent is extended or adjusted under 35 U.S.C. 154(b) by 154 days.

(21) Appl. No.: 12/783,900

(22) Filed: May 20, 2010

(65) Prior Publication Data

US 2010/0295536 A1    Nov. 25, 2010

(30) Foreign Application Priority Data

May 22, 2009    (JP) ................................. 2009-123749

(51) Int. Cl.
*G01R 23/02* (2006.01)

(52) U.S. Cl.
USPC ................... 324/76.39; 324/76.41; 324/76.44; 324/76.48; 324/76.47; 327/47; 327/48; 327/49; 377/19; 377/47; 377/48; 377/49; 377/105; 377/121

(58) Field of Classification Search
USPC ............ 377/19, 47–49, 105, 121; 327/47–49; 324/76.39, 76.41, 76.44, 76.48, 76.47
See application file for complete search history.

(56) References Cited

U.S. PATENT DOCUMENTS

| 2,627,033 | A | 1/1953 | Jensen et al. |
|---|---|---|---|
| 2,840,812 | A | 6/1958 | Di Giacomo |
| 2,944,219 | A | 7/1960 | Tanaka et al. |
| 3,026,473 | A | 3/1962 | De Mott |
| 3,056,085 | A | 9/1962 | James et al. |
| 3,144,623 | A | 8/1964 | Steiner |
| 3,227,952 | A | 1/1966 | Proebster et al. |
| 3,310,660 | A * | 3/1967 | Cogar ........................... 377/111 |
| 3,372,346 | A | 3/1968 | Rogers et al. |
| 3,407,290 | A | 10/1968 | Atrubin |
| 3,440,617 | A | 4/1969 | Lesti |
| 3,486,007 | A | 12/1969 | Jacobson |

(Continued)

FOREIGN PATENT DOCUMENTS

| JP | 53-111768 | 9/1978 |
|---|---|---|
| JP | A-56-169923 | 12/1981 |

(Continued)

OTHER PUBLICATIONS

Katano, K., "Introduction to Proper Method for Using Measuring Instruments; How to Use Timing Devices," Transistor Technology Seminar, 14th Installment, Feb. 1994, p. 331-338 (with English translation).

(Continued)

*Primary Examiner* — Arleen M Vazquez
*Assistant Examiner* — Lamarr Brown
(74) *Attorney, Agent, or Firm* — Oliff & Berridge, PLC

(57) ABSTRACT

A frequency measuring apparatus includes: a counter section adapted to count a signal including a pulse signal for a predetermined time period, and output a binary count value corresponding to a frequency of the signal including the pulse signal; and a low pass filter section adapted to perform a filtering process on the count value, wherein the low pass filter section includes a first stage filter and a second stage filter, the first stage filter is a moving average filter to which the count value is input, and which provides a binary output with a high-frequency component reduced, and the second stage filter performs an average value calculation on the binary output to provide an output with the high-frequency component reduced.

9 Claims, 28 Drawing Sheets

(56) References Cited

U.S. PATENT DOCUMENTS

| | | | |
|---|---|---|---|
| 3,551,826 A | 12/1970 | Sepe | |
| 3,553,579 A | 1/1971 | Teixeira | |
| 3,557,796 A | 1/1971 | Keller et al. | |
| 3,605,017 A | 9/1971 | Chertok et al. | |
| 3,609,308 A * | 9/1971 | Lemon et al. | 377/24 |
| 3,624,494 A | 11/1971 | Turan | |
| 3,652,838 A | 3/1972 | Dillon et al. | |
| 3,686,565 A | 8/1972 | Kelem et al. | |
| 3,697,870 A * | 10/1972 | Brenner | 324/244 |
| 3,704,414 A | 11/1972 | Herbst | |
| 3,708,686 A | 1/1973 | Butler, Jr. et al. | |
| 3,733,471 A * | 5/1973 | Gilberg | 377/129 |
| 3,736,510 A | 5/1973 | Wu | |
| 3,742,353 A | 6/1973 | Parisi | |
| 3,743,940 A * | 7/1973 | Yamagata | 324/166 |
| 3,745,380 A | 7/1973 | Kitajima et al. | |
| 3,750,014 A | 7/1973 | Gaw | |
| 3,755,734 A | 8/1973 | Blanyer | |
| 3,761,740 A | 9/1973 | Naïve | |
| 3,766,818 A | 10/1973 | Prohofsky | |
| 3,775,681 A | 11/1973 | Konrad | |
| 3,777,121 A | 12/1973 | Jamieson | |
| 3,780,346 A * | 12/1973 | Gagnon | 361/238 |
| 3,795,771 A * | 3/1974 | Gundersen et al. | 370/242 |
| 3,803,487 A | 4/1974 | Iten | |
| 3,812,427 A | 5/1974 | Coulter | |
| 3,823,374 A | 7/1974 | Dandliker et al. | |
| 3,838,338 A | 9/1974 | Khoury | |
| 3,875,518 A | 4/1975 | Odams | |
| 3,930,199 A | 12/1975 | Valis | |
| 3,942,123 A | 3/1976 | Georgi | |
| 3,943,460 A | 3/1976 | Arai | |
| 4,041,387 A | 8/1977 | Dalichow et al. | |
| 4,051,434 A | 9/1977 | Sweet | |
| 4,053,839 A * | 10/1977 | Knoedl, Jr. | 377/47 |
| 4,063,169 A | 12/1977 | Palmer | |
| 4,130,799 A | 12/1978 | Cherry | |
| 4,137,497 A | 1/1979 | Lowenschuss | |
| 4,139,819 A | 2/1979 | Worley | |
| 4,139,870 A | 2/1979 | Tachi | |
| 4,144,490 A | 3/1979 | Stevens | |
| 4,150,432 A | 4/1979 | Sorden | |
| 4,169,213 A | 9/1979 | Dye et al. | |
| 4,310,891 A | 1/1982 | Niki | |
| 4,339,722 A * | 7/1982 | Sydor et al. | 377/47 |
| 4,345,206 A * | 8/1982 | Skalka | 324/76.44 |
| 4,368,354 A | 1/1983 | Furihata et al. | |
| 4,374,358 A | 2/1983 | Hirose | |
| 4,389,642 A | 6/1983 | Kahn | |
| 4,420,809 A | 12/1983 | Pierce | |
| 4,494,067 A | 1/1985 | Barszczewski | |
| 4,514,592 A | 4/1985 | Miyaguchi | |
| 4,544,892 A | 10/1985 | Kaufman et al. | |
| 4,546,490 A | 10/1985 | Miller-Thomson et al. | |
| 4,583,211 A * | 4/1986 | Nishikawa et al. | 369/59.1 |
| 4,588,979 A * | 5/1986 | Adams | 341/131 |
| 4,603,292 A | 7/1986 | Russell | |
| 4,609,990 A | 9/1986 | Sember et al. | |
| 4,616,173 A | 10/1986 | Cook et al. | |
| 4,651,089 A * | 3/1987 | Haigh | 324/76.42 |
| 4,667,689 A | 5/1987 | Kohashi | |
| 4,670,712 A * | 6/1987 | Lavergnat et al. | 324/76.39 |
| 4,672,556 A | 6/1987 | Shepler | |
| 4,695,791 A | 9/1987 | Miller | |
| 4,695,792 A * | 9/1987 | Roy | 324/76.82 |
| 4,707,653 A | 11/1987 | Wagner | |
| 4,716,363 A | 12/1987 | Dukes et al. | |
| 4,760,536 A | 7/1988 | Curtis | |
| 4,769,836 A | 9/1988 | Aihara | |
| 4,795,963 A | 1/1989 | Ueno et al. | |
| 4,864,588 A * | 9/1989 | Simpson et al. | 375/365 |
| 4,864,634 A | 9/1989 | Nakagawa et al. | |
| 4,866,260 A * | 9/1989 | Lescourret | 324/76.28 |
| 4,880,005 A * | 11/1989 | Pless et al. | 607/15 |
| 4,942,365 A * | 7/1990 | Satterwhite | 327/41 |
| 4,984,254 A | 1/1991 | Thomas | |
| 5,027,228 A * | 6/1991 | Yokoyama | 360/15 |
| 5,065,095 A | 11/1991 | Suzuki | |
| 5,095,279 A | 3/1992 | Quan et al. | |
| 5,122,758 A | 6/1992 | Tomita | |
| 5,128,607 A | 7/1992 | Clark et al. | |
| 5,157,699 A | 10/1992 | Miyazaki et al. | |
| 5,168,215 A * | 12/1992 | Puzzo | 324/76.44 |
| 5,206,549 A | 4/1993 | Suzuki et al. | |
| 5,262,714 A | 11/1993 | Friedman | |
| 5,302,916 A | 4/1994 | Pritchett | |
| 5,304,938 A | 4/1994 | Gregory et al. | |
| 5,313,154 A | 5/1994 | Norris | |
| 5,317,215 A | 5/1994 | Kranzler | |
| 5,323,096 A | 6/1994 | Nakai | |
| 5,365,181 A | 11/1994 | Mair | |
| 5,381,085 A | 1/1995 | Fischer | |
| 5,442,278 A | 8/1995 | Fan Chiang et al. | |
| 5,448,606 A * | 9/1995 | Snelgrove | 377/34 |
| 5,471,133 A * | 11/1995 | Sezi | 324/76.44 |
| 5,509,040 A | 4/1996 | Shimada | |
| 5,539,355 A * | 7/1996 | Nakamura | 329/302 |
| 5,555,247 A | 9/1996 | Matsuoka et al. | |
| 5,650,954 A | 7/1997 | Minuhin | |
| 5,652,552 A | 7/1997 | Chung | |
| 5,710,710 A * | 1/1998 | Owen et al. | 702/75 |
| 5,764,045 A | 6/1998 | Hayashi | |
| 5,941,974 A | 8/1999 | Babin | |
| 6,018,560 A | 1/2000 | Kim | |
| 6,078,200 A | 6/2000 | Miyano | |
| 6,127,950 A | 10/2000 | Yamauchi | |
| 6,140,869 A | 10/2000 | Troise | |
| 6,172,579 B1 | 1/2001 | Dacus et al. | |
| 6,181,829 B1 | 1/2001 | Clark et al. | |
| 6,259,251 B1 * | 7/2001 | Sugiura et al. | 324/318 |
| 6,265,869 B1 * | 7/2001 | Takahashi | 324/212 |
| 6,282,803 B1 * | 9/2001 | Dunne | 33/361 |
| 6,359,938 B1 | 3/2002 | Keevill et al. | |
| 6,360,090 B1 | 3/2002 | Holcombe et al. | |
| 6,377,616 B1 | 4/2002 | Brankovic et al. | |
| 6,411,075 B1 * | 6/2002 | Battiston et al. | 324/76.39 |
| 6,463,452 B1 | 10/2002 | Schulist | |
| 6,519,194 B2 | 2/2003 | Tsujino et al. | |
| 6,549,479 B2 | 4/2003 | Blodgett | |
| 6,566,964 B1 * | 5/2003 | Hirano | 331/1 A |
| 6,590,400 B2 * | 7/2003 | Hilliard et al. | 324/654 |
| 6,665,367 B1 | 12/2003 | Blair | |
| 6,674,277 B1 | 1/2004 | Oishi et al. | |
| 6,675,326 B1 | 1/2004 | Yoshizaki | |
| 6,680,607 B2 * | 1/2004 | Smith | 324/76.79 |
| 6,759,838 B2 | 7/2004 | Tao et al. | |
| 6,834,093 B1 * | 12/2004 | Chiu | 377/39 |
| 6,888,902 B1 | 5/2005 | Kondo | |
| 6,917,191 B2 | 7/2005 | Oishi et al. | |
| 7,027,940 B2 | 4/2006 | Iannuzzi | |
| 7,046,964 B1 | 5/2006 | Sullivan et al. | |
| 7,068,744 B2 | 6/2006 | Watanabe | |
| 7,124,153 B2 * | 10/2006 | Grushin | 708/103 |
| 7,230,458 B2 | 6/2007 | DaDalt | |
| 7,242,223 B1 | 7/2007 | Alon | |
| 7,265,559 B1 | 9/2007 | Hladky et al. | |
| 7,266,756 B2 | 9/2007 | Saado et al. | |
| 7,271,631 B2 | 9/2007 | Watanabe | |
| 7,276,978 B2 | 10/2007 | Puma et al. | |
| 7,285,961 B2 * | 10/2007 | Shinmoto et al. | 324/541 |
| 7,372,875 B2 | 5/2008 | Hadzic et al. | |
| 7,394,723 B2 | 7/2008 | Rubin | |
| 7,409,031 B1 | 8/2008 | Lee et al. | |
| 7,429,896 B2 * | 9/2008 | Hattori | 331/44 |
| 7,436,265 B2 * | 10/2008 | Park et al. | 331/18 |
| 7,466,789 B2 * | 12/2008 | Rieubon et al. | 377/94 |
| 7,504,976 B1 * | 3/2009 | Pellon | 341/143 |
| 7,560,962 B2 * | 7/2009 | Kamath | 327/158 |
| 7,636,747 B2 | 12/2009 | Watanabe | |
| 7,642,767 B2 * | 1/2010 | Willis | 324/76.47 |
| 7,653,170 B2 * | 1/2010 | Mattes et al. | 377/20 |
| 7,692,419 B1 | 4/2010 | Peel | |
| 7,696,741 B2 * | 4/2010 | Gurr | 324/76.39 |
| 7,729,071 B2 | 6/2010 | Harada | |

(56) References Cited

U.S. PATENT DOCUMENTS

| | | | |
|---|---|---|---|
| 7,737,688 | B2 | 6/2010 | Tomida et al. |
| 7,750,618 | B1 | 7/2010 | Fang et al. |
| 7,750,685 | B1* | 7/2010 | Bunch et al. ............. 327/48 |
| 7,804,289 | B2* | 9/2010 | Li ............. 324/76.39 |
| 7,847,597 | B1* | 12/2010 | Chan et al. ............. 327/47 |
| 7,907,016 | B2 | 3/2011 | Eikenbroek |
| 7,932,751 | B2* | 4/2011 | Boomer ............. 327/44 |
| 8,139,685 | B2 | 3/2012 | Simic et al. |
| 8,140,283 | B2* | 3/2012 | Benmouyal et al. ............. 702/72 |
| 8,242,941 | B2 | 8/2012 | Arknaes-Pedersen et al. |
| 8,258,831 | B1* | 9/2012 | Banai et al. ............. 327/155 |
| 8,461,821 | B2 | 6/2013 | Todorokihara |
| 8,508,213 | B2 | 8/2013 | Todorokihara |
| 2001/0045868 | A1 | 11/2001 | Takeyabu et al. |
| 2001/0048348 | A1* | 12/2001 | Unterricker ............. 331/11 |
| 2002/0024343 | A1 | 2/2002 | Moore |
| 2002/0097091 | A1* | 7/2002 | Takagishi ............. 330/251 |
| 2002/0167874 | A1 | 11/2002 | Hayashi |
| 2002/0180415 | A1* | 12/2002 | Roth ............. 324/76.41 |
| 2003/0038624 | A1* | 2/2003 | Hilliard et al. ............. 324/200 |
| 2003/0046064 | A1 | 3/2003 | Moriya et al. |
| 2003/0062959 | A1 | 4/2003 | Tsuda et al. |
| 2003/0165112 | A1 | 9/2003 | Noda |
| 2003/0176932 | A1 | 9/2003 | Wild |
| 2003/0184346 | A1 | 10/2003 | Lamb |
| 2003/0215100 | A1 | 11/2003 | Kimura et al. |
| 2004/0075425 | A1 | 4/2004 | Horio et al. |
| 2004/0078737 | A1 | 4/2004 | Miyamoto |
| 2004/0196052 | A1 | 10/2004 | Okayasu |
| 2004/0199345 | A1 | 10/2004 | Ananthanarayanan et al. |
| 2005/0025270 | A1 | 2/2005 | Muhammad et al. |
| 2005/0110500 | A1 | 5/2005 | Hoyte et al. |
| 2005/0147197 | A1 | 7/2005 | Perrott |
| 2005/0237125 | A1 | 10/2005 | Hino |
| 2005/0270043 | A1 | 12/2005 | Iacob et al. |
| 2006/0084386 | A1 | 4/2006 | Irie et al. |
| 2006/0120537 | A1* | 6/2006 | Burnett et al. ............. 381/71.6 |
| 2006/0171496 | A1 | 8/2006 | Nakamuta et al. |
| 2006/0246865 | A1 | 11/2006 | Makarov |
| 2006/0267698 | A1* | 11/2006 | Erdogan et al. ............. 331/17 |
| 2006/0285756 | A1 | 12/2006 | Sugita |
| 2007/0094581 | A1 | 4/2007 | Kajita |
| 2007/0103333 | A1 | 5/2007 | Michaiski et al. |
| 2007/0132442 | A1* | 6/2007 | Jones ............. 324/76.29 |
| 2007/0159938 | A1 | 7/2007 | Sugawara et al. |
| 2007/0216556 | A1* | 9/2007 | Rieubon et al. ............. 341/120 |
| 2008/0019471 | A1 | 1/2008 | Waldner |
| 2008/0104072 | A1* | 5/2008 | Stampleman et al. ............. 707/6 |
| 2008/0122498 | A1* | 5/2008 | Furukawa ............. 327/115 |
| 2008/0136471 | A1* | 6/2008 | Kamath ............. 327/156 |
| 2008/0165862 | A1 | 7/2008 | Takahashi |
| 2008/0189064 | A1* | 8/2008 | Yamaguchi et al. ............. 702/69 |
| 2008/0191762 | A1* | 8/2008 | Seethamraju et al. ............. 327/158 |
| 2008/0204088 | A1 | 8/2008 | Garlapati et al. |
| 2008/0229829 | A1 | 9/2008 | Kondo |
| 2008/0247500 | A1 | 10/2008 | Goto et al. |
| 2008/0256157 | A1 | 10/2008 | Bostaman et al. |
| 2008/0291287 | A1* | 11/2008 | Dvir ............. 348/222.1 |
| 2008/0320065 | A1 | 12/2008 | Kan |
| 2009/0058452 | A1 | 3/2009 | Tanaka et al. |
| 2009/0058468 | A1* | 3/2009 | Hjelm et al. ............. 327/40 |
| 2009/0144018 | A1 | 6/2009 | Chang et al. |
| 2009/0153256 | A1 | 6/2009 | Jo et al. |
| 2009/0156150 | A1 | 6/2009 | Deleon |
| 2009/0180527 | A1 | 7/2009 | Asami |
| 2009/0192958 | A1 | 7/2009 | Todorokihara |
| 2009/0237070 | A1* | 9/2009 | Herselman ............. 324/76.39 |
| 2009/0240994 | A1* | 9/2009 | Lee ............. 714/700 |
| 2009/0243736 | A1 | 10/2009 | Miura et al. |
| 2009/0251129 | A1 | 10/2009 | Todorokihara et al. |
| 2009/0261809 | A1* | 10/2009 | Li ............. 324/76.39 |
| 2009/0295460 | A1 | 12/2009 | Gulba et al. |
| 2009/0296878 | A1* | 12/2009 | Tsai ............. 377/47 |
| 2010/0052653 | A1* | 3/2010 | LeBrun ............. 324/76.47 |
| 2010/0054390 | A1 | 3/2010 | Kim et al. |
| 2010/0091752 | A1* | 4/2010 | Kemmochi et al. ............. 370/339 |
| 2010/0213924 | A1* | 8/2010 | Osumi et al. ............. 324/76.44 |
| 2010/0289479 | A1* | 11/2010 | Prance et al. ............. 324/76.39 |
| 2010/0295535 | A1 | 11/2010 | Todorokihara |
| 2010/0295536 | A1 | 11/2010 | Todorokihara |
| 2010/0295537 | A1 | 11/2010 | Todorokihara |
| 2010/0315061 | A1 | 12/2010 | Tomita et al. |
| 2011/0050352 | A1 | 3/2011 | Kondo et al. |
| 2011/0068828 | A1 | 3/2011 | Anderson et al. |
| 2011/0074514 | A1 | 3/2011 | Marutani |
| 2011/0082656 | A1 | 4/2011 | Todorokihara |
| 2011/0084687 | A1* | 4/2011 | Todorokihara ............. 324/76.19 |
| 2011/0150168 | A1* | 6/2011 | Tseng et al. ............. 377/47 |
| 2011/0182398 | A1 | 7/2011 | Iwashita et al. |
| 2011/0235772 | A1 | 9/2011 | Obkircher |
| 2012/0019301 | A1 | 1/2012 | Murray |
| 2012/0053903 | A1 | 3/2012 | Todorokihara |
| 2012/0161815 | A1 | 6/2012 | Polivka |

FOREIGN PATENT DOCUMENTS

| | | |
|---|---|---|
| JP | A-61-223662 | 10/1986 |
| JP | A-62-298726 | 12/1987 |
| JP | A-64-054271 | 3/1989 |
| JP | A-64-057189 | 3/1989 |
| JP | A-01-182758 | 7/1989 |
| JP | A-01-269297 | 10/1989 |
| JP | A-02-252306 | 10/1990 |
| JP | A-04-048271 | 2/1992 |
| JP | A-04-072815 | 3/1992 |
| JP | A-04-357468 | 12/1992 |
| JP | A-05-030772 | 4/1993 |
| JP | A-5-172861 | 7/1993 |
| JP | A-05-327515 | 12/1993 |
| JP | A-06-011525 | 1/1994 |
| JP | A-06-501554 | 2/1994 |
| JP | A-06-164372 | 6/1994 |
| JP | A-06-235743 | 8/1994 |
| JP | A-06-342021 | 12/1994 |
| JP | A-07-055554 | 3/1995 |
| JP | A-7-229910 | 8/1995 |
| JP | A-07-260526 | 10/1995 |
| JP | A-09-178785 | 7/1997 |
| JP | A-09-304259 | 11/1997 |
| JP | A-10-132874 | 5/1998 |
| JP | A-10-170566 | 6/1998 |
| JP | A-11-154921 | 6/1999 |
| JP | A-11-220369 | 8/1999 |
| JP | A-11-264846 | 9/1999 |
| JP | A-2000-307384 | 11/2000 |
| JP | A-2001-94395 | 4/2001 |
| JP | A-2001-119291 | 4/2001 |
| JP | A-2001-166008 | 6/2001 |
| JP | A-2001-177378 | 6/2001 |
| JP | A-2002-057583 | 2/2002 |
| JP | A-2003-065768 | 3/2003 |
| JP | A-2003-179491 | 6/2003 |
| JP | A-2003-194860 | 7/2003 |
| JP | A-2003-249905 | 9/2003 |
| JP | A-2003-307481 | 10/2003 |
| JP | A-2003-315356 | 11/2003 |
| JP | A-2005-020554 | 1/2005 |
| JP | A-2006-029874 | 2/2006 |
| JP | A-2006-165912 | 6/2006 |
| JP | A-2007-60447 | 3/2007 |
| JP | A-2008-131500 | 6/2008 |
| JP | A-2008-147837 | 6/2008 |
| JP | A-2009-229353 | 10/2009 |
| JP | A-2009-250807 | 10/2009 |
| JP | A-2009-250808 | 10/2009 |
| JP | A-2010-085286 | 4/2010 |
| JP | A-2010-127914 | 6/2010 |
| JP | A-2010-271210 | 12/2010 |
| JP | A-2010-271211 | 12/2010 |
| WO | WO 85-04487 A | 10/1985 |
| WO | WO 92/04634 A1 | 3/1992 |

OTHER PUBLICATIONS

Oct. 11, 2011 Office Action issued in U.S. Appl. No. 12/418,000.

(56) References Cited

OTHER PUBLICATIONS

Feb. 29, 2012 Office Action issued in U.S. Appl. No. 12/782,382.
Mar. 7, 2012 Office Action issued in U.S. Appl. No. 12/418,000.
Office Action issued Dec. 14, 2011 in U.S. Appl. No. 12/782,382.
Office Action issued Dec. 29, 2011 in U.S. Appl. No. 12/835,108.
Office Action issued Jan. 6, 2012 in U.S. Appl. No. 12/784,136.
Office Action dated May 25, 2012 issued in U.S. Appl. No. 12/782,382.
Office Action dated May 23, 2012 issued in U.S. Appl. No. 12/784,136.
Jun. 5, 2012 Office Action issued in U.S. Appl. No. 12/418,000.
Jul. 31, 2012 Office Action issued in U.S. Appl. No. 12/418,000.
Sep. 14, 2012 Office Action issued in U.S. Appl. No. 12/784,136.
Sep. 19, 2012 Office Action issued in U.S. Appl. No. 12/782,382.
Oct. 17, 2012 Office Action issued in U.S. Appl. No. 12/889,770.
U.S. Appl. No. 12/835,108 in the name of Kondo filed Jul. 13, 2010.
U.S. Appl. No. 12/889,770 in the name of Todorokihara, filed Sep. 24, 2010.
U.S. Appl. No. 12/784,136 in the name of Todorokihara, filed May 20, 2010.
U.S. Appl. No. 12/782,382 in the name of Todorokihara, filed May 18, 2010.
U.S. Appl. No. 12/418,000 in the name of Todorokihara, filed Apr. 3, 2009.
U.S. Appl. No. 12/896,106 in the name of Todorokihara, filed Oct. 1, 2010.
U.S. Appl. No. 13/211,726 in the name of Todorokihara, filed Aug. 17, 2011.
Nov. 13, 2012 Office Action issued in U.S. Appl. No. 12/896,106.
Nov. 28, 2012 Office Action issued in U.S. Appl. No. 12/418,000.
Nov. 30, 2012 Notice of Allowance issued in U.S. Appl. No. 12/782,382.
Feb. 6, 2013 Notice of Allowance issued in U.S. Appl. No. 12/784,136.
Jan. 31, 2013 Office Action issued in U.S. Appl. No. 12/889,770.
Apr. 19, 2013 Notice of Allowance issued in U.S. Appl. No. 12/889,770.
Apr. 8, 2013 Office Action issued in U.S. Appl. No. 12/835,108.
Jul. 23, 2012 Office Action issued in U.S. Appl. No. 12/835,108.
Mar. 13, 2013 Notice of Allowance issued in U.S. Appl. No. 12/782,382.
Corrected Notice of Allowability dated Jul. 11, 2013 issued in U.S. Patent and Trademark Office U.S. Appl. No. 12/782,382.
Jul. 16, 2013 Notice of Allowance issued in U.S. Appl. No. 12/889,770.
Jul. 8, 2013 Office Action issued in U.S. Appl. No. 12/896,106.
Notice of Allowance dated Sep. 10, 2013 issued in U.S. Appl. No. 12/835,108.
U.S. Office Action in U.S. Appl. No. 13/211,726 mailed Sep. 25, 2013.
Nov. 22, 2013 Notice of Allowance issued in U.S. Appl. No. 12/896,106.

* cited by examiner

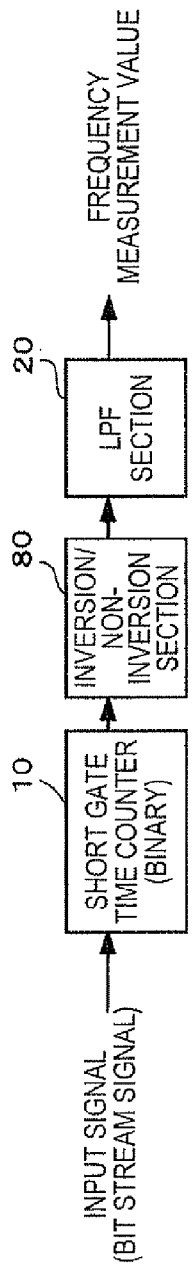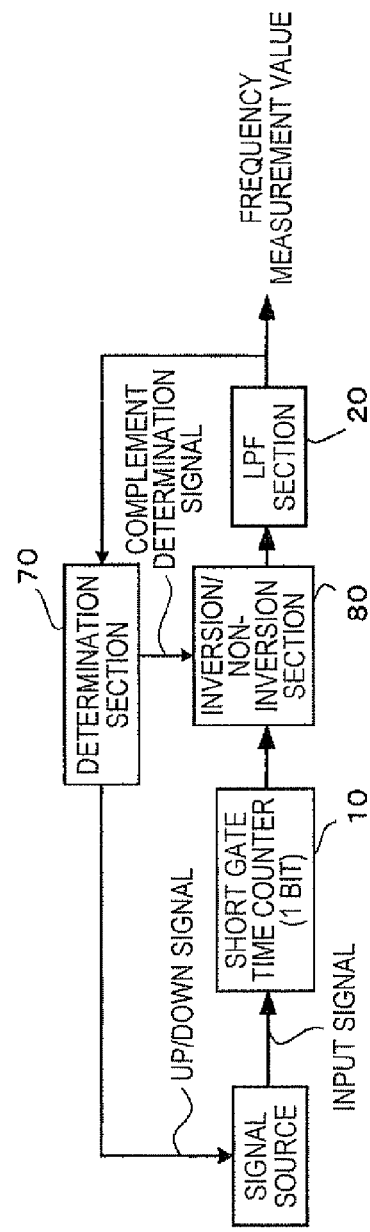

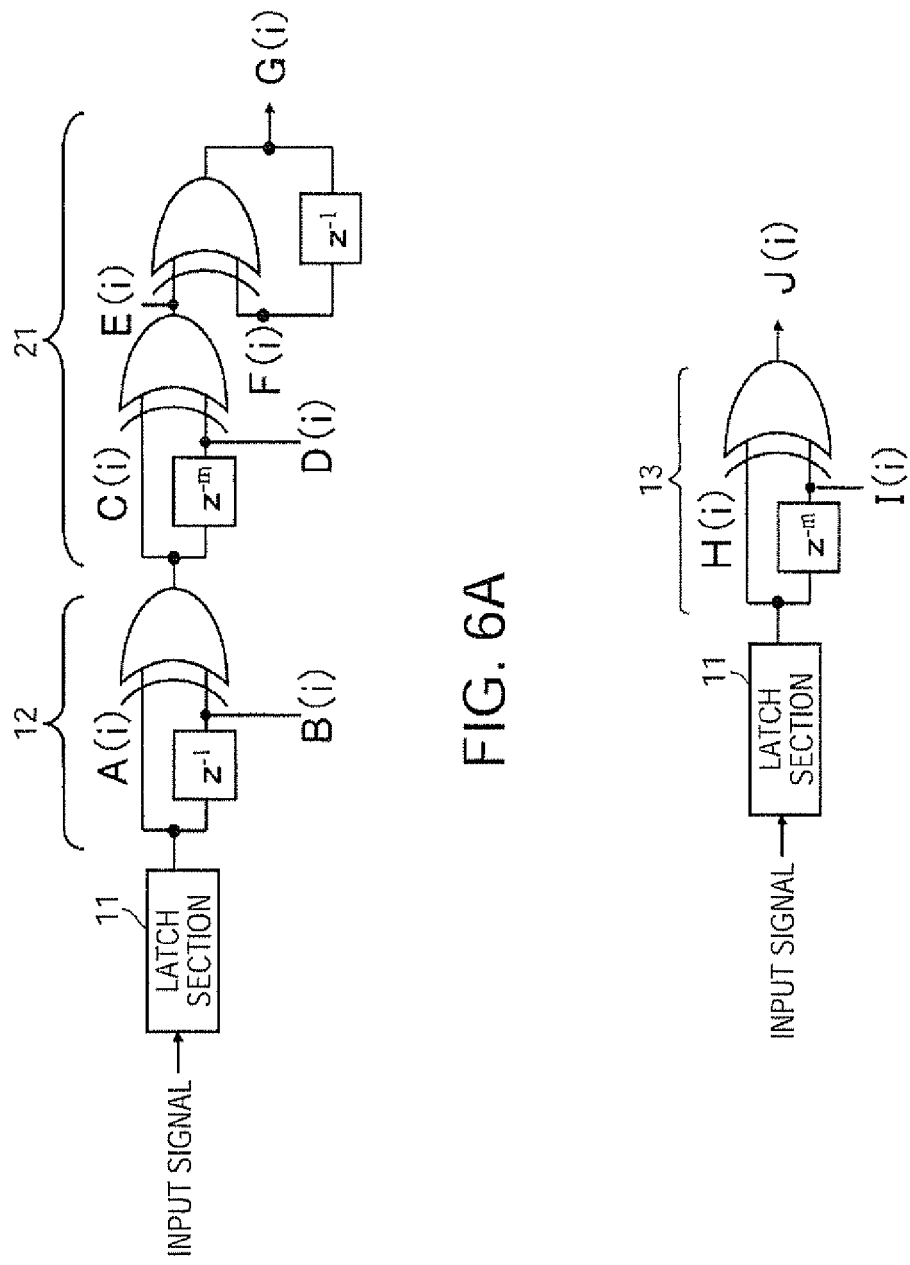

$H(i) = A(i)$
$I(i) = H(i-n) = A(i-n)$
$J(i) = H(i) + I(i) = A(i) + A(i-n)$ $B(i) = A(i-1)$
$C(i) = A(i) + B(i) = A(i) + A(i-1)$
$D(i) = C(i-n) = A(i-n) + A(i-n-1)$
$E(i) = C(i) + D(i) = A(i) + A(i-1) + A(i-n) + A(i-n-1)$
$F(i) = G(i-1)$
$G(i) = E(i) + F(i) = E(i) + G(i-1)$
$\qquad = E(i) + E(i-1) + G(i-2)$
$\qquad = E(i) + E(i-1) + E(i-2) + G(i-3)$
$\qquad \cdots$
$\qquad = E(i) + E(i-1) + E(i-2) + \cdots + E(1) + G(0)$

FIG. 7

$E(i) = A(i) + A(i-1) + A(i-n) + A(i-n-1)$
$G(i) = E(i) + E(i-1) + E(i-2) + \cdots + E(1) + G(0)$

| | | | |
|---|---|---|---|
| = $A(i)$ | +$A(i-1)$ | +$A(i-n)$ | +$A(i-n-1)$ |
| + $A(i-1)$ | +$A(i-2)$ | +$A(i-n-1)$ | +$A(i-n-2)$ |
| + $A(i-2)$ | +$A(i-3)$ | +$A(i-n-2)$ | +$A(i-n-3)$ |
| + $A(i-3)$ | +$A(i-4)$ | +$A(i-n-3)$ | +$A(i-n-4)$ |
| + $\cdots$ | | | |
| + $A(n+1)$ | +$A(n)$ | +$A(2)$ | +$A(1)$ |
| + $A(n)$ | +$A(n-1)$ | +$A(1)$ | +$A(0)$ |
| + $A(n-1)$ | +$A(n-2)$ | +$A(0)$ | |
| + $\cdots$ | | | |
| + $A(2)$ | +$A(1)$ | | |
| + $A(1)$ | +$A(0)$ | | |
| + $A(0)$ | | | |

$\begin{pmatrix} 0+0=0 \\ 0+1=1 \\ 1+0=1 \\ 1+1=0 \end{pmatrix}$

FIG. 8

$$E(i) = A(i) + A(i-1) + A(i-n) + A(i-n-1)$$
$$G(i) = E(i) + E(i-1) + E(i-2) + \cdots + E(1) + G(0)$$

$$\begin{aligned}
= \ & A(i) && +A(i-1) && +A(i-n) && +A(i-n-1) \\
+ \ & A(i-1) && +A(i-2) && +A(i-n-1) && +A(i-n-2) \\
+ \ & A(i-2) && +A(i-3) && +A(i-n-2) && +A(i-n-3) \\
+ \ & A(i-3) && +A(i-4) && +A(i-n-3) && +A(i-n-4) \\
+ \ & \ldots \\
+ \ & A(n+1) && +A(n) && +A(2) && +A(1) \\
+ \ & A(n) && +A(n-1) && +A(1) && +A(0) \\
+ \ & A(n-1) && +A(n-2) && +A(0) \\
+ \ & \ldots \\
+ \ & A(2) && +A(1) \\
+ \ & A(1) && +A(0) \\
+ \ & A(0)
\end{aligned}$$

$$\therefore G(i) = A(i) + A(i-n) = J(i)$$

$$\begin{pmatrix} 0+0=0 \\ 0+1=1 \\ 1+0=1 \\ 1+1=0 \end{pmatrix}$$

FIG. 9

FREQUENCY MEASURING APPARATUS

The entire disclosure of Japanese Patent Application No. 2009-123749, filed May 22, 2009 is expressly incorporated by reference herein.

BACKGROUND

1. Technical Field

The present invention relates to a frequency measuring apparatus or the like, and in particular to improvement of a frequency measuring apparatus for making it possible to measure an absolute frequency using a frequency measuring apparatus for counting an input signal in a predetermined time period, and removing a high-frequency component from a counted value train, thereby detecting a frequency variation component.

2. Related Art

As a method of measuring a frequency, there are known a direct count method (see, e.g., JP-A-2001-119291) of counting pulses passing therethrough in a predetermined gate time, a reciprocal method (see, e.g., JP-A-5-172861) of accurately measuring the pulse period and obtaining the frequency using the inverse of the period thus measured, and a method (see, e.g., U.S. Pat. No. 7,230,458) of obtaining a $\Delta\Sigma$ modulation signal to thereby find out the frequency.

The applicant of the present patent application performs development of a frequency measuring apparatus using a short gate time count method as a novel proposal in addition to the methods described above.

The frequency count method described above is arranged to repeatedly count (sample) a signal including the pulse signal as the input signal in a short gate time without interruption, and then remove the high-frequency component from the train of the count values thus obtained to thereby extract the frequency variation component (a filtering process), which can significantly improve both of the time resolution and the frequency resolution. The frequency counter of the present method is composed of a counter circuit and a small-scale arithmetic circuit, and has an advantage of easily achieving a multi-channel configuration while suppressing growth of the circuit scale. Further, it also has a characteristic that the higher the sampling frequency (the inverse of the gate time of the counter circuit) is set, the more the resolution is improved.

In order for removing the high-frequency component described above, there is used a low pass filter. For example, in the case of using a digital filter as a configuration of the low pass filter section, a memory and an arithmetic device become necessary. By using a moving average filter as the low pass filter, an amount of operation can significantly be reduced, and the real-time measurement with high accuracy can be achieved. The counter circuit (a short gate time counter described later) has a simple configuration also as hardware, and is therefore suitable for a high-speed operation on the one hand, on the other hand the process in the filter section requires multi-bit addition and subtraction. Therefore, the upper limit of the sampling frequency in the real-time measurement is mainly determined by processing capacity of the filter section. In particular, when using the moving average filter of two or more stages, processing of multi-bit information becomes necessary, and therefore, the circuit thereof becomes complicated. If the circuit of the part described above is simplified, operation with a higher speed, a real-time processing, and reduction of power consumption become possible.

SUMMARY

An advantage of some aspects of the invention is to provide a frequency measuring apparatus making it possible to simplify the circuit such as a low pass filter as much as possible, and thereby allowing a faster circuit operation and lower power consumption.

Another advantage of some aspects of the invention is to provide a frequency measuring apparatus which can more easily be configured in the case in which the input signal is a pulse train signal (e.g., a bit stream signal) with binary levels.

Still another advantage of some aspects of the invention is to provide a frequency measuring apparatus in which a circuit of a low pass filter and so on composed of two or more stages of filters is simplified as much as possible in the frequency measuring apparatus having an output formed as a bit stream (as a serial digital output), thereby making it possible to achieve higher-speed circuit operation and lower power consumption thereof.

According to an aspect of the invention, there is provided a frequency measuring apparatus, including a counter section adapted to count a signal (an input signal) including a pulse signal for a predetermined time period, and output a binary count value corresponding to a frequency of the signal including the pulse signal, and a low pass filter section adapted to perform a filtering process on the count value, wherein the low pass filter section includes a first stage filter and a second stage filter, the first stage filter is a moving average filter to which the count value is input, and which provides a binary output with a high-frequency component reduced, and the second stage filter performs an average value calculation on the binary output to provide an output with the high-frequency component reduced. Here, the filtering process is a process for removing an undesired component (a high-frequency component) from the output of the short gate time counter section to thereby extract an object component (a frequency variation component of the input signal).

By adopting such a configuration, it becomes possible to make the flow of the signal from the input section of the counter to the output section of the first stage moving average filter of the low pass filter a bit stream, and further to reduce the number of times of average value calculation of the low pass filter section to thereby simplify the configuration. Thus, it becomes possible to achieve simplification, growth in speed, and reduction of power consumption of the circuit.

It is preferable that an operation frequency of the second stage filter is lower than an operation frequency of the first stage filter. Since the high-frequency component is reduced by the first stage moving average filter, degradation of filter performance is small even if the sampling frequency (or an operating frequency) of the filter in the posterior stage is lowered. By setting the frequency of the output operation of the filter in the second stage to be lower than the frequency of the output operation of the filter in the first stage, it becomes possible to make the circuit simpler and lower in power consumption.

It is preferable that the second stage filter is a moving average filter.

It is preferable that the second stage filter includes an up counter adapted to calculate an interval average value. Since the up counter only performs addition, and does not perform subtraction unlike the up-down counter, and therefore, has a simple circuit configuration, and is capable of a high-speed operation.

It is preferable that the up counter includes an asynchronous counter or a Gray code counter. These counters have simpler circuit configurations and perform faster operations compared to up-down counters. Further, they have an advantage of low power consumption of the circuit.

A part of the counter section and the first stage moving average filter are mainly composed of a latch circuit, a shift register circuit, and an exclusive OR circuit. Thus, the 1-bit counter and moving average filter can be obtained with a simple circuit configuration.

It is preferable that the frequency measuring apparatus described above further includes an inversion/noninversion control section disposed between an output end of the counter section and an output end of the low pass filter section, and adapted to perform one of inversion and noninversion on a train of binary outputs in accordance with an inversion/noninversion instruction supplied. Thus, if the binary output of the counter is output in a complement state, the binary output is conveniently corrected.

Further, the frequency measuring apparatus according to the above aspect of the invention further includes a polarization determination circuit (determination section) adapted to increase or decrease the frequency of the input signal, determine an increase/decrease direction of the count value output from the counter in response thereto, and output an inversion/noninversion instruction corresponding to forward/reverse direction of the count value of the counter based on the determination result.

Although in the case in which the frequency variation of the measured pulse train signal is small, it is possible to easily configure the circuit of the counter section using the 1-bit counter, in this case, it is unclear whether the values of "0" and "1" used for counting denote large and small (true values) or denote complements, and therefore, the polarity determination circuit changes the frequency of the pulse train signal in one direction, and determines whether or not the count value increases or decreases in response thereto, thereby making it possible to determine the meaning (true values or complements) of the count values.

It is preferable that one or more stages of moving average filters are disposed in a posterior stage of the second stage moving average filter. Thus, a better low pass filter characteristic can be obtained.

It is preferable that a D/A converter section is disposed in the posterior stage of the second stage moving average filter. Thus, a better low pass filter characteristic can be obtained.

The frequency measuring apparatus described above is preferably used for a QCM (quartz crystal microbalance) device arranged to convert a minute mass change on a surface of a vibrator substrate into a frequency variation by using the QCM method with the quartz oscillator, such as a mass sensor, an odor sensor, a gas sensor, a biosensor, and so on.

BRIEF DESCRIPTION OF THE DRAWINGS

The invention will be described with reference to the accompanying drawings, wherein like numbers reference like elements.

FIGS. 1A and 1B are block diagrams for explaining an example of a frequency measuring apparatus using a short gate time count method provided with a circuit for correcting forward/reverse of the output of a short gate time counter with a 1-bit output.

FIGS. 6A and 6B are block diagrams for explaining how the 1-bit short gate counter and the single-stage moving average filter are represented by an equivalent circuit.

FIG. 7 is an explanatory diagram for explaining how the 1-bit short gate counter and the single-stage moving average filter are represented by an equivalent circuit.

FIG. 8 is an explanatory diagram for explaining how the 1-bit short gate counter and the single-stage moving average filter are represented by an equivalent circuit.

FIG. 9 is an explanatory diagram for explaining how the 1-bit short gate counter and the single-stage moving average filter are represented by an equivalent circuit.

DESCRIPTION OF EXEMPLARY EMBODIMENTS

Figure 2A:
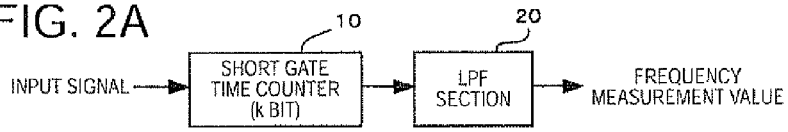
FIGS. 2A through 2H are explanatory diagrams for explaining a procedure of simplification of a circuit of the short gate time counter.

Embodiments of the invention will hereinafter be described with reference to the accompanying drawings.

In the frequency measuring apparatus using the short gate time count method according to an aspect of the invention, the flow of a signal from an input section of an input signal to an output section of a single moving average filter is made as a bit stream (an output train of a binary signal). Further, in order for processing the signal with a circuit having a binary output, parameters such as an input signal frequency, a sampling frequency, the operating point parameter, the number of taps of the single-stage moving average filter, and the dynamic range are adjusted so that no carry and no borrow are caused in the bit stream section.

As described later, the operating point parameter is defined as follows.

(Operating point parameter)=(measured frequency)/(sampling frequency)−Int((measured frequency)/(sampling frequency))

It should be noted that Int(c) represents a function of returning the integral part of "c." According to the definitional equation, the value of the operating point parameter takes a value between 0 and 1. The operating point parameter relates to a pattern noise level.

The dynamic range is defined as "(sampling frequency)/(the number of taps of moving average filter)." If the frequency variation of the input signal is made to fall within the dynamic range, no carry (overflow) and no borrow (underflow) are caused in the output of the moving average filter.

First Embodiment

Firstly, the short gate time count method explained in the present application is a method of continuously counting the pulse train signal supplied thereto in a short gate time to obtain a series of count values acting as a pulse train corresponding to the frequency of the pulse train signal, then removing a high-frequency component from the series of count values to obtain a series of signals corresponding to the frequency of the pulse train signal supplied thereto, thereby extracting the frequency variation. Regarding fundamentals of such a short gate time count method, the circuit configuration and the operation thereof are explained in detail in JP-A-2009-250807. Further, an example of configuring a short gate time count type frequency measuring apparatus with 1-bit counter is explained in JP-A-2009-250808.

FIGS. 1A and 1B are block diagrams for explaining an example of configuring the frequency measuring apparatus with a counter having 1-bit (binary) output using the short gate time count method.

As shown in the drawings, the frequency measuring apparatus is composed mainly of a short gate time counter section 10, a low pass filter section 20, and an inversion/non-inversion section 80.

The short gate time counter section 10 continuously counts the frequency of the input signal (the pulse train signal), which is supplied from a quartz oscillator or the like of a QCM device not shown, with the counter having 1-bit output in a predetermined gate time to generate the count output of the bit stream (a series of binary outputs). In the case in which the frequency variation range of the signal source is known, it is possible to make the 1-bit counter perform an operation not causing the carry by appropriately setting the sampling frequency of the short gate time counter section 10. Under such conditions, it is possible to obtain the measuring result with the 1-bit counter.

As described later, for example, the simplified short gate time counter section 10 is configured including a data latch operating at a sampling frequency fs, a binary counter with 1-bit output, and a moving average filter with a tap count "m."

The low pass filter section 20 removes (performs a filtering process on) a high-frequency component from the count output of the bit stream signal output by the short gate time counter section 10 to thereby output a measurement value corresponding to the frequency variation. The filtering process is a process for removing an unwanted thing included therein to retrieve target information.

As described above, in the output of the 1-bit counter, there are two cases, one is the case (the case of positive output) in which the train of "0" and "1" corresponds positively to the amount of the measurement value, the other is the case (complement output) in which the output value train is reversed (complement). In this case, for example, if the frequency of the input signal is manually increased or decreased and the count value increases or decreases in response thereto, it can be determined that the output value positively corresponds to the input frequency. Further, if the frequency of the input signal is increased or decreased and the count value decreases or increases, it can be determined that the output value represents the complement output.

The inversion/non-inversion section 80 relays the binary output of the short gate time counter section to the low pass filter section 20 after inverting or noninverting the binary output based on the polarity determination result described above. Thus, even in the case with the frequency measuring apparatus using the 1-bit counter, a correct frequency count value can be obtained.

FIG. 1B shows an example of the frequency measuring apparatus using the short gate time count method arranged to automatically performing the complement determination and correction on the counter output described above.

In the drawing, the sections corresponding to those shown in FIG. 1A are denoted by the same reference numerals, and the description therefor will be omitted.

As described above, in the case of performing the sampling with the binary counter having 1-bit output, and outputting the count value, it is not achievable to determine whether the output of 0 and 1 of the count value corresponds positively to the amount of the count value or they have a complementary relationship based on the 1-bit information. Therefore, in the present embodiment, a bit determination section 70 is further provided. The other constituents are substantially the same as those shown in FIG. 1A.

The determination section 70 is configured as, for example, a function executed by a computer system along a control program. The determination section 70 (more precisely, a computer) operates in response to generation of a predetermined event. Firstly, the determination section 70 increases or decreases the oscillation frequency of the signal source 10 in accordance with an up-down signal. In the case in which the output of the low pass filter section 20 increases or decreases in accordance therewith, it is determined that the output "0" and "1" of the counter section 10 corresponds positively to the amount of the count value.

Further, in the case in which the oscillation frequency of the signal source 10 is increased or decreased, and the output of the low pass filter decreases or increases in accordance therewith, it is determined that the output "0" and "1" of the counter section 10 has the complement relationship (reversed output). If it has the complement relationship, the determination section 70 provides the inversion/non-inversion section 80 with a complement determination signal to make the inversion/non-inversion section 80 invert the output "0" and "1" of the counter section 10, and then relay it to the low pass filter section 20.

It should be noted that the output monitored by the determination section 70 can be the output of the counter section 10 or the output of the inversion/non-inversion section 80 besides the output of the low pass filter section 20.

Then, simplification of the circuit of the frequency measuring apparatus of the short gate time count method using the counter with 1-bit (binary) output will be explained.

FIGS. 2A through 2G show respective stages in a procedure of simplifying the circuit of the frequency measuring apparatus. In the drawings, corresponding sections are denoted by the same reference numerals, and the description therefor will be omitted.

Firstly, as shown in FIG. 2A, the basic frequency measuring apparatus with the short gate time count method is provided with the counter with k-bit output as the short gate time counter section 10 for counting the input signal (the pulse train signal supplied from the quartz oscillator or the like of the QCM device) at a predetermined sampling frequency, and the low pass filter section 20 for removing a high-frequency component from the continuous count value train output by the counter section 10 to thereby extract the frequency variation component.

Figure 2B:
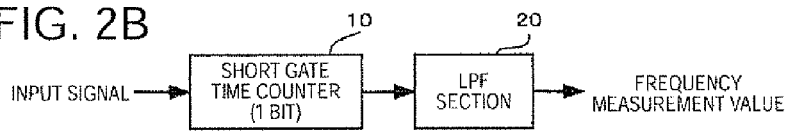

In FIG. 2B, the short gate time counter section is formed of a 1-bit output counter. It is assumed that the frequency variation range of the input signal is known or a sufficiently large range (e.g., a+3b assuming that a denotes the variation range, and b denotes the fluctuation of the width of the range) with a good margin. For example, in some quartz oscillators or the like of the QCM devices described above, the frequency variation range has previously been known. Therefore, as described later, the sampling frequency has previously been selected ((the frequency variation range)<(the sampling frequency)) so as not to generate carry or borrow in the counting result. Under the present condition, 1-bit counter can be used as the short gate time counter section 10. The low pass filter section 20 performs the signal processing on the continuous binary output of the 1-bit counter as the short gate time counter 10.

Figure 2C:
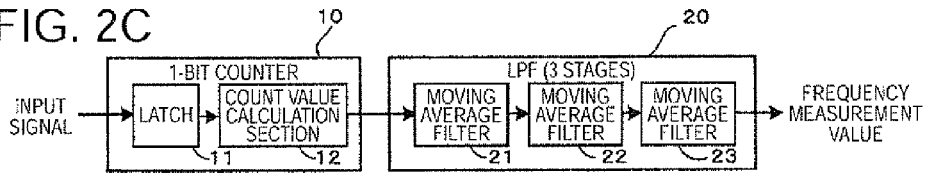

As shown in FIG. 2C, the 1-bit counter can be composed mainly of, for example, a latch 11 operating at the sampling frequency, and a count value calculation section 12 functioning as a counter of 1 bit. The output of the 1-bit counter takes "0" when the retention value is "0," and "0" is input, "1" when the retention value is "0," and "1" is input, "1" when the retention value is "1," and "0" is input, or "0" when the retention value is "1," and "1" is input. The low pass filter section 20 can be composed of, for example, three stages of moving average filters 21 through 23.

Figure 2D:
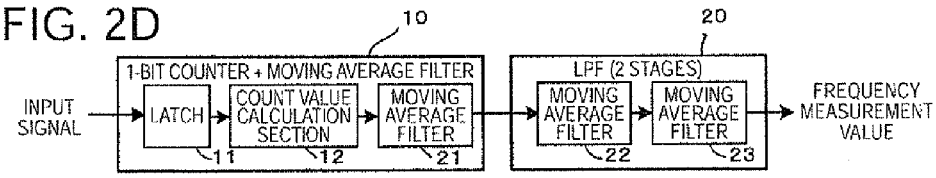

As shown in FIG. 2D, from a viewpoint of a circuit, the configuration of moving the moving average filter 21 in the first stage of the three stages of the moving average filters 21 through 23 of the low pass filter section 20 to the side of the 1-bit counter as the short gate time counter 10 is equivalent thereto.

Figure 2E:
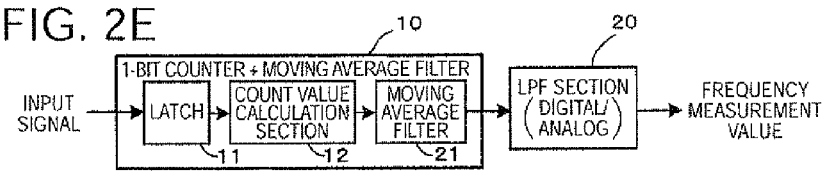

As shown in FIG. 2E, the remaining low pass filter section 20 is only required to function as a low pass filter. As described later, either of a digital filter and an analog filter capable of providing a desired characteristic can be adopted.

Figure 3:
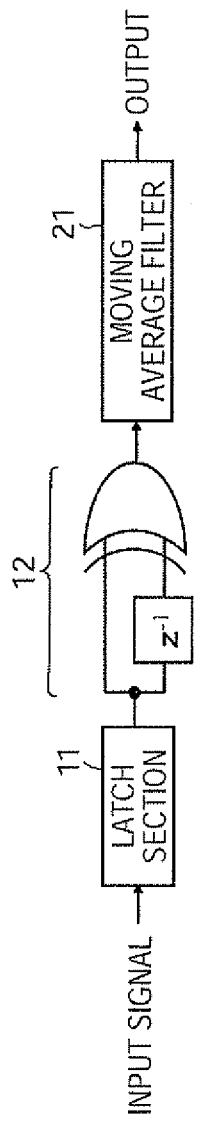
FIG. 3 is a block diagram for explaining a configuration example of the 1-bit counter and a moving average filter having a bit stream configuration.
Figure 4:
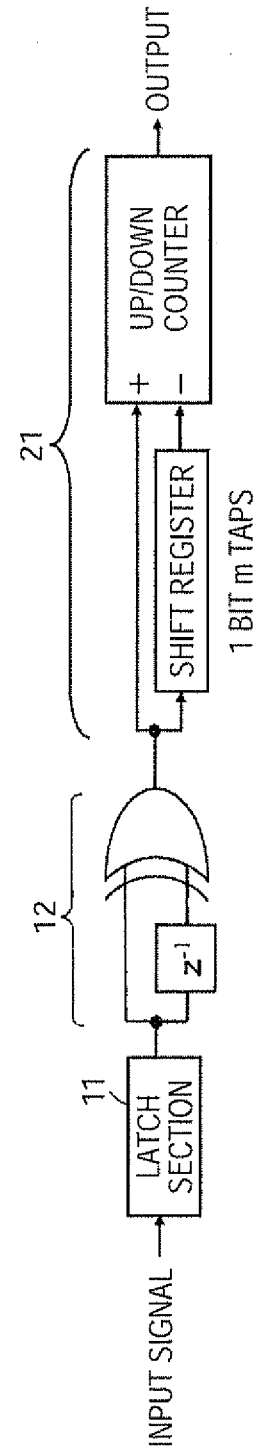
FIG. 4 is a block diagram showing a configuration example of the moving average filter.

FIG. 3 shows a specific configuration example of the latch section 11, the count value calculation section 12, and the moving average filter 21 shown in FIGS. C through E. The 1-bit counter can be composed mainly of one latch 11, one register $z^{-1}$, and one exclusive OR circuit. The moving average filter 21 can be composed mainly of a shift register $z^{-m}$ of 1 bit m taps (m stages), and an up-down counter (FIG. 4 described later).

Figure 2F:
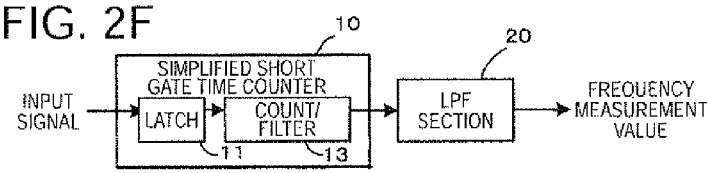

FIG. 2F shows an example configured with a count/filter section 13 described later obtained by simplifying the count value calculation section 12 and the moving average filter 21 describe above.

Figure 2G:
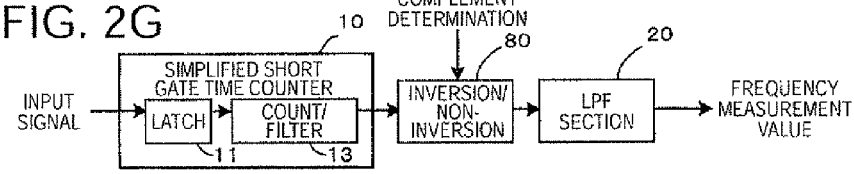

Further, as shown in FIG. 2G, in the case of using the 1-bit counter section as the short gate time counter 10 (or the case in which the signal processing is performed with the bit stream of the binary signal), the output becomes in the complement state in some cases, and therefore, it is arranged that the inversion/non-inversion section 80 described above is disposed in the posterior stage (corresponding to the output of the first stage moving average filter) of the count/filter section 13 so as to appropriately perform inversion/non-inversion of the count output. The operation of the inversion/non-inversion section 80 is controlled by the determination section 70 (see FIG. 1B). In the manner as described above, the correct count value output can be maintained.

Figure 2H:
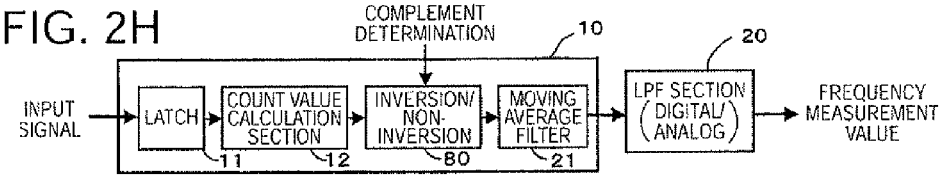

FIG. 2H shows an example of disposing the inversion/non-inversion section 80 between the count value calculation section 12 and the moving average filter 21. Further, although not shown in the drawings, the inversion/non-inversion section 80 can be disposed in the posterior stage of the low pass filter section 20. As described above, the inversion/non-inversion section 80 can be disposed at a convenient location.

FIG. 4 shows a configuration example of the moving average filter 21. The moving average filter 21 can be composed of the shift register $z^{-m}$ of 1 bit m taps (m stages), and an up-down counter receiving the output of the count value calculation section 12 in an up-input (+) and the output of the shift register $z^{-m}$ in a down-input (−) thereof.

Figure 5A:
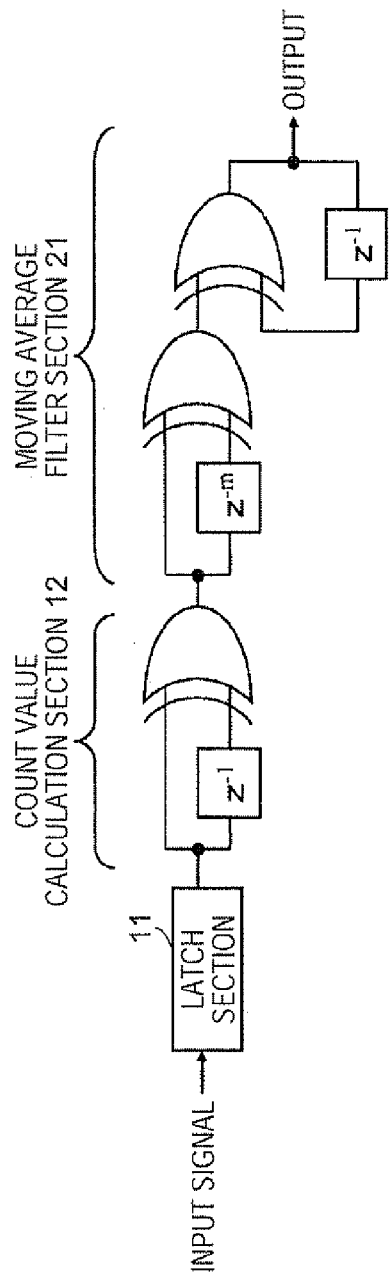
FIGS. 5A and 5B are block diagrams for explaining how the 1-bit short gate counter and a single-stage moving average filter are represented by an equivalent circuit.

FIG. 5A shows an example of configuring the moving average filter (an up-down counter type) 21 shown in FIG. 4 with an m-tap shift register, an exclusive OR circuit, a single tap shift register, and another exclusive OR circuit. In the case of a bit stream operation, since increment and decrement bring the same result, the up-down counter is equivalent to an exclusive OR circuit.

Figure 5B:
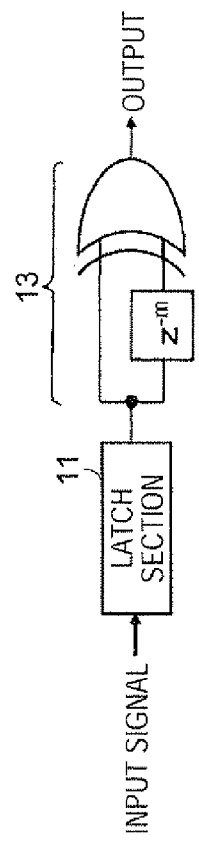

Further, FIG. 5B shows an example of replacing the part of FIG. 5A corresponding to the count value calculation section 12 and the moving average filter 21 with the m-tap shift register $z^{-m}$ and the exclusive OR circuit as the equivalent circuit thereof.

FIGS. 6A, 6B, and 7 through 9 are diagrams for explaining the fact that the logic circuit shown in FIG. 5A and the logic circuit shown in FIG. 5B are equivalent to each other. When setting the signals A(i) through J(i) of the respective sections as shown in FIGS. 6A and 6B, G(i)=A(i)+A(i−n)=J(i) is obtained as shown in FIG. 9.

Using the result, the function of the count value calculation section 12 and the moving average filter can be replaced with the simplified count/filter section 13 (FIG. 5B) having the equivalent function as shown in FIG. 2F.

Then, parameters (the dynamic range, the operating point parameter) to be selected in the short gate time count type frequency measuring apparatus for processing the bit stream (serial digital data) signal described above will be explained. The dynamic range relates to generation of carry and borrow in the short gate time counter section 10. The operating point parameter relates to generation of the pattern noise and the noise level thereof.

Firstly, conditions with which carry and borrow do not occur in the bit stream signal processing will be explained.

Figure 10:
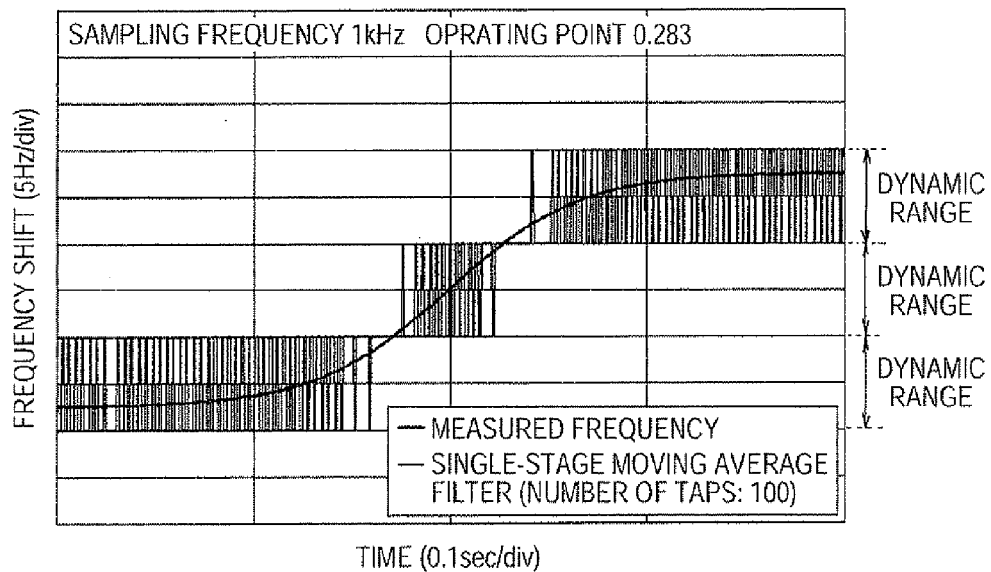
FIG. 10 is a graph showing an output example (an example of the case with a large frequency variation) of the short gate counter and the single-stage moving average filter.

FIG. 10 shows an output example (a single-stage moving average filter) in the case in which, for example, the sampling frequency is set to be 1 kHz, the operating point parameter is set to be around 0.283, and the number of taps of the first stage moving average filter 21 is set to be 100 in the short gate time counter section (1-bit counter and the single-stage moving average filter) 10 shown in FIG. 2E. When the input signal (indicated by a thick solid line in the drawing) with a relatively large frequency variation is input as shown in the drawing, overflow occurs, and the output takes multiple values as indicated in the drawing by thin lines.

The condition causing the overflow is "(frequency variation in the input signal)>(dynamic range of single-stage moving average filter)." In this case, the dynamic range is represented by "(sampling frequency)/(the number of taps of moving average filter)."

When applying the above to the example shown in FIG. 10, the frequency variation is about 25 Hz, the sampling frequency is 1 kHz, and the number of taps is 100. The dynamic range is obtained as 1 kHz/100=10 Hz. Since (frequency variation (about 25 Hz))>(dynamic range (10 Hz)) is satisfied, the output of the moving average filter takes multiple values.

Figure 11:
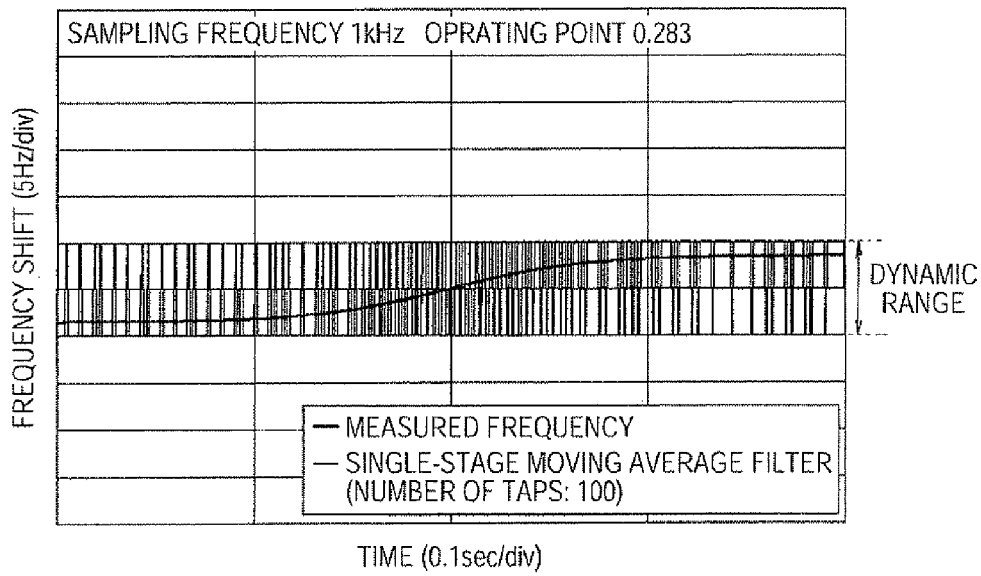
FIG. 11 is a graph showing an output example (an example of the case with a small frequency variation) of the short gate counter and the single-stage moving average filter.

FIG. 11 shows an example of the case in which the frequency variation of the input signal is relatively small. Other conditions are the same as in the case shown in FIG. 10. The output of the moving average filter 21 falls within two values. The condition preventing the overflow is "(frequency variation in the input signal)<(dynamic range of single-stage moving average filter)." By satisfying the condition, the signal can be processed as a bit stream (a binary signal train).

In a specific application, the frequency variation is about 7 Hz. Since (frequency variation (7 Hz))<(dynamic range (10 Hz)) is satisfied, the requirement described above is satisfied, and the output value of the moving average filter 21 can be made to fall within two values.

Figure 12:
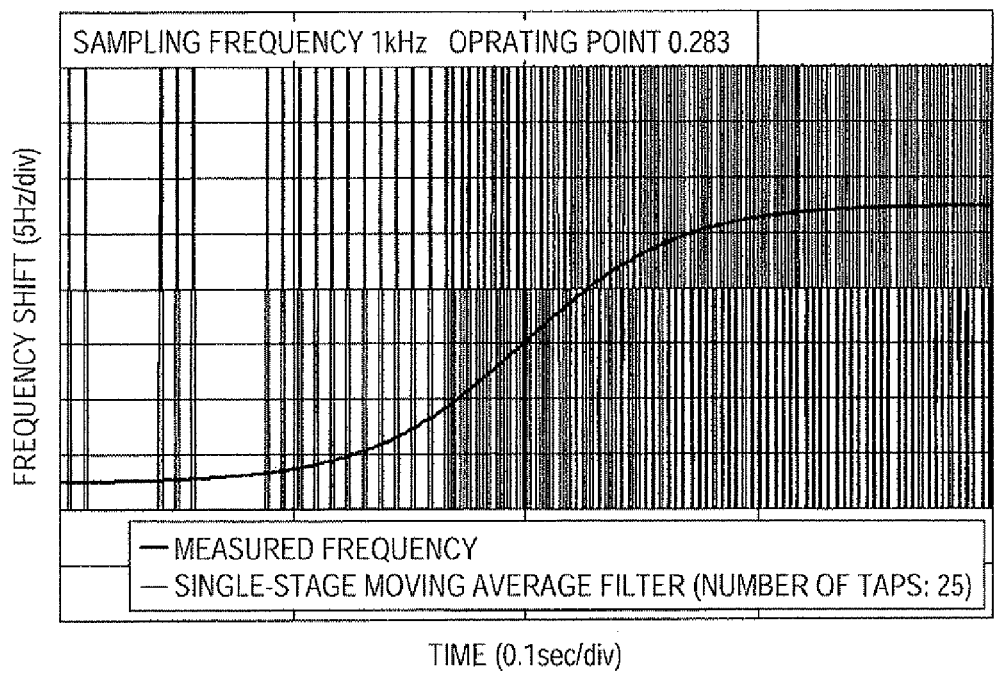
FIG. 12 is a graph showing an output example (an example of adjusting the number of taps) of the short gate counter and the single-stage moving average filter.

FIG. 12 shows an example of reducing the number of taps to thereby cope with the treatment of the bit stream in the frequency variation measurement of the input signal shown in FIG. 10. By reducing the number of taps of the moving average filter from 100 to 25, the dynamic range is increased from 10 Hz to 40 Hz (1 kHz/25=40 Hz) to thereby satisfy the requirement described above.

Figure 13:
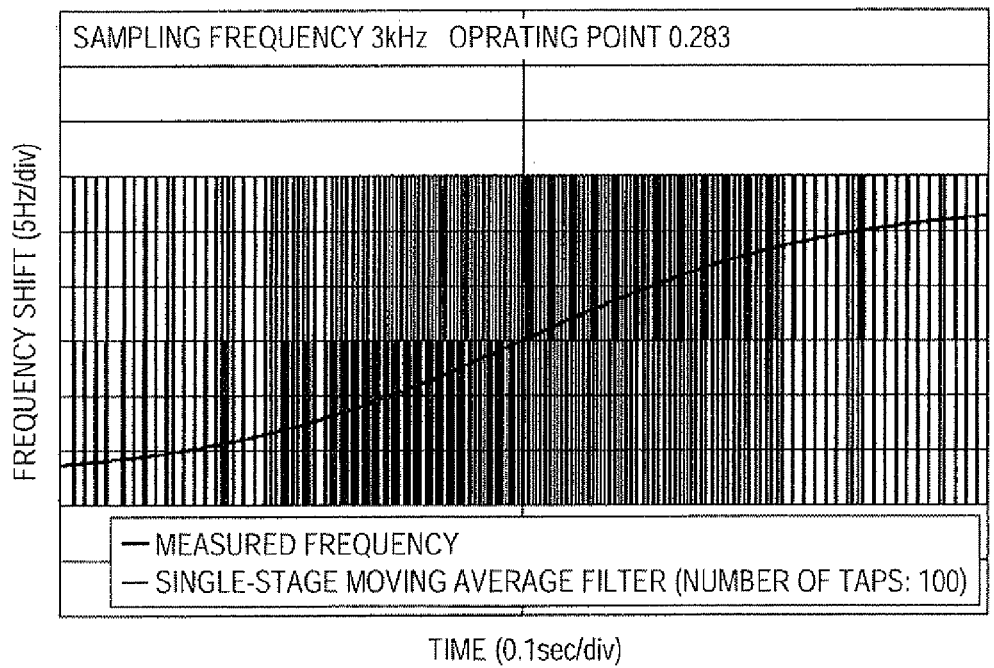
FIG. 13 is a graph showing an output example (an example of adjusting a sampling frequency) of the short gate counter and the single-stage moving average filter.

FIG. 13 shows an example of raising the sampling frequency to thereby cope with the treatment of the bit stream in the frequency variation measurement of the input signal shown in FIG. 10. The operation frequency of the counter and the moving average filter is raised from 1 kHz to 3 kHz, thereby increasing the dynamic range from 10 Hz to 30 Hz (3 kHz/100=30 Hz) to satisfy the requirement described above.

As described above, in the short gate count method, it is possible to prevent the overflow from occurring by appropriately selecting the parameters related to the dynamic range. The frequency of the input signal falls within the dynamic range, the count value becomes within two values, and the information can be expressed by the bit stream.

As the parameters related to the dynamic range, there can be cited the frequency of the input signal, the sampling frequency fs, the tap count m of the single-stage moving average filter 21, and so on.

Figure 14:
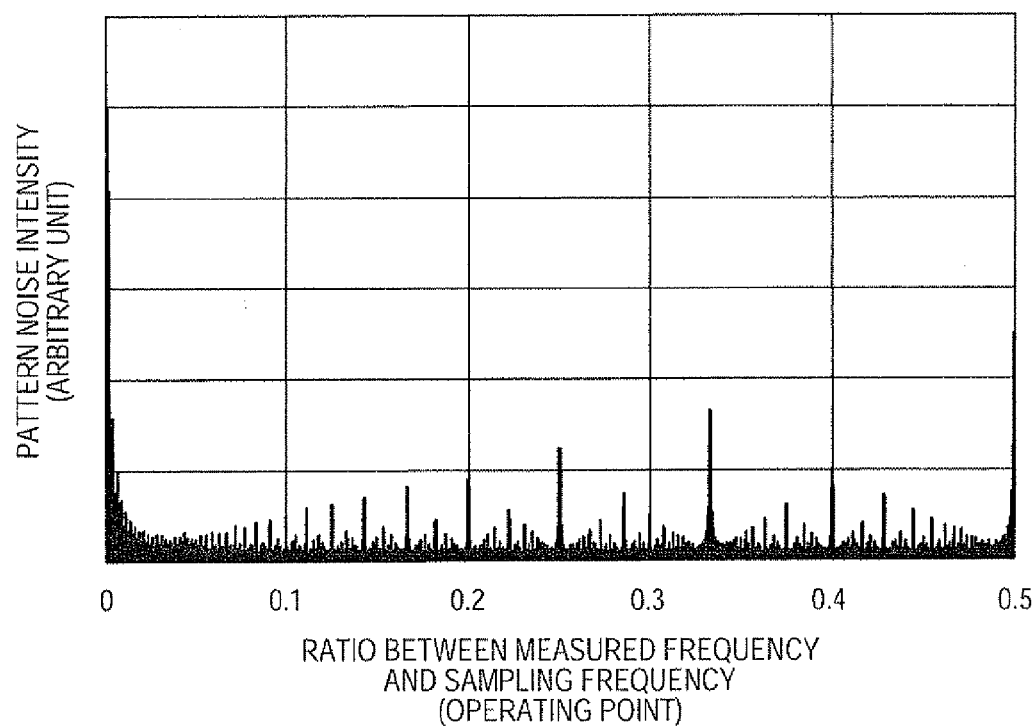
FIG. 14 is an explanatory diagram for explaining a pattern noise.

FIG. 14 shows an example of operating point parameter dependency of a pattern noise intensity distribution in the short gate time count method.

As described above, the operating point parameter is defined as "(measured frequency)/(sampling frequency)−Int((measured frequency)/(sampling frequency))." It should be noted that Int(c) represents a function of returning the integral part of "c."

According to the definitional equation, it is understood that the operating point parameter takes a value between 0 and 1. In the short gate time count method, generation of the pattern noise is observed in the output. The intensity of the pattern noise is a complicated function of the operating point parameter, and has a symmetrical property about the operating point parameter of 0.5. In other words, the pattern noise has a property that the pattern noise intensity at the operating point parameter of 0.5−d is equal to the pattern noise intensity at the operating point parameter of 0.5+d (0<d≤0.5).

Therefore, FIG. 14 shows the relationship between the noise intensity and the operating point parameter in the range of the operating point parameter of 0 through 0.5.

As is understood from the drawing, in the case in which the operating point parameter (a ratio between the measured frequency and the sampling frequency) takes a value near to a simple rational number, a large pattern noise is generated. In the first order ΔΣ modulation, some input value causes periodic series in the output, and the pattern noise generated in response to application of a similar input is known, which is an analogy of the phenomenon described above.

However, there is a difference in concept between the method of avoiding the pattern noise in the ΔΣ modulation and the method of avoiding the pattern noise in the short gate time count method. In the case of the ΔΣ modulation, in order for suppressing the pattern noise itself, a high order configuration or a multi-stage configuration is devised. This is caused by the fact that the A/D converter using the ΔΣ modulation deals with an input signal variation substantially equivalent to the dynamic range. In the case of the short gate time count method, since the width of the input signal variation can be designed so as to fall within a certain range with respect to the dynamic range, the harmful pattern noise can be avoided by appropriately selecting the range of the operating point parameter without changing the configuration.

It is understood that when selecting the conditions of binarization described above, the S/N ratio can be improved by selecting the parameters so that the operating point parameter also takes an appropriate value.

Then, the inversion of the short gate count output in the short gate time counter method described above will be explained with reference to FIGS. 15 through 18.

Figure 15:
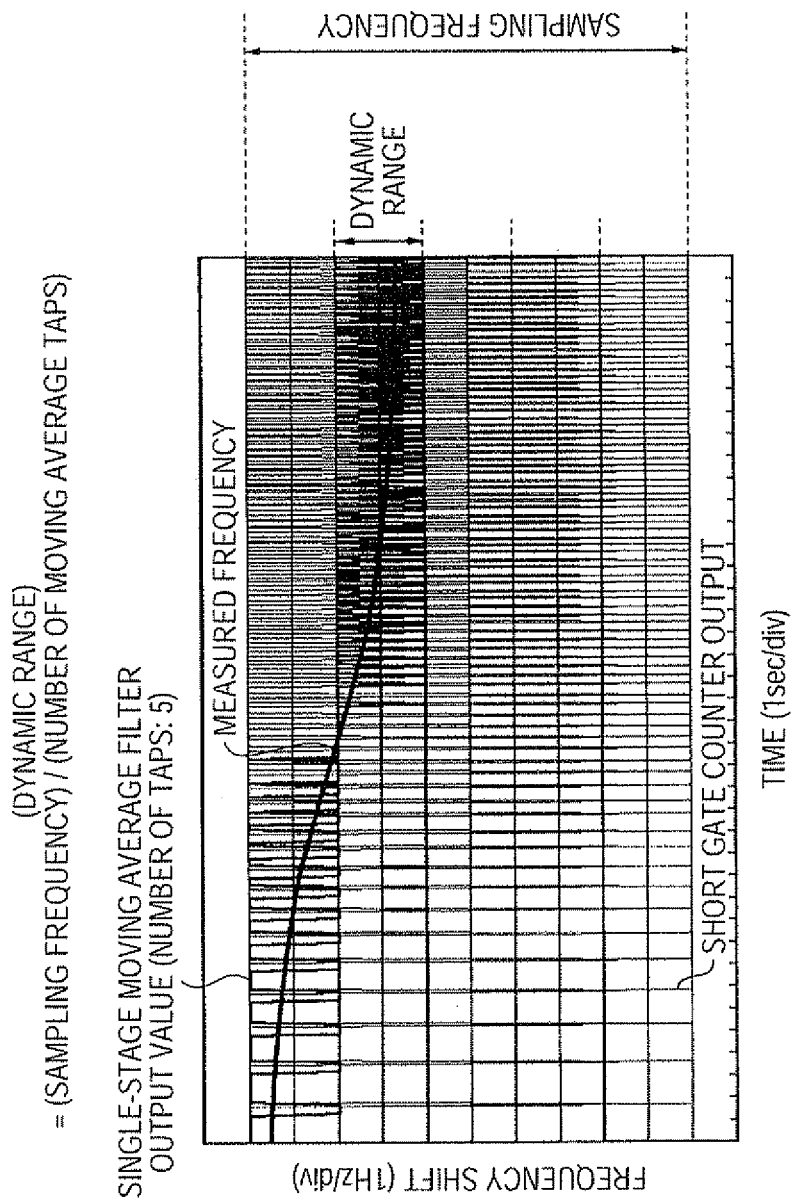
FIG. 15 is an explanatory diagram for explaining a dynamic range in the single-stage moving average filter output.

FIG. 15 is a graph for explaining the relationship between the sampling frequency, the number of taps of the moving average filter, and the dynamic range in the case of treating the short gate count output and the single-stage moving average filter output as a bit stream as described above.

The horizontal axis of the graph shown in the drawing represents time (second), and the vertical axis represents a frequency shift (Hz). In the graph, there are shown an output (a pulsed output illustrated with thin lines between the lower limit value and the upper limit value of the sampling frequency) of the short gate counter, an output (a pulsed output illustrated with thick lines) of the moving average filter (the number of taps is 5), and an output (an output of the moving average filter illustrated with a curved line in the pulse train) of the low pass filter in the case in which the gate time is set to be 0.1 second (the sampling frequency of 10 Hz). The same is applied to FIGS. 16 through 18 below.

As described above, the dynamic range is defined as "(dynamic range)=(sampling frequency)/(the number of taps of moving average filter)." In this example, the dynamic range is 2 (=10/5). If the frequency variation of the input signal falls within the dynamic range, no carry and no borrow occur in the counter, and the output (the output of the single-stage moving average filter) of the counter section becomes in the binary output state, thus the bit stream output is achieved. This can be achieved by selecting the sampling frequency and the number of taps of the moving average filter with respect to the frequency of the input signal. By making the signal of the part corresponding to the short gate time counter and the single-stage moving average filter as a bit stream, the circuit configuration corresponding to the part can be simplified by the logic gate or the like as described above. The subsequent circuit can also perform the process with a digital (binary) circuit, and can therefore, be simplified.

Figure 16:
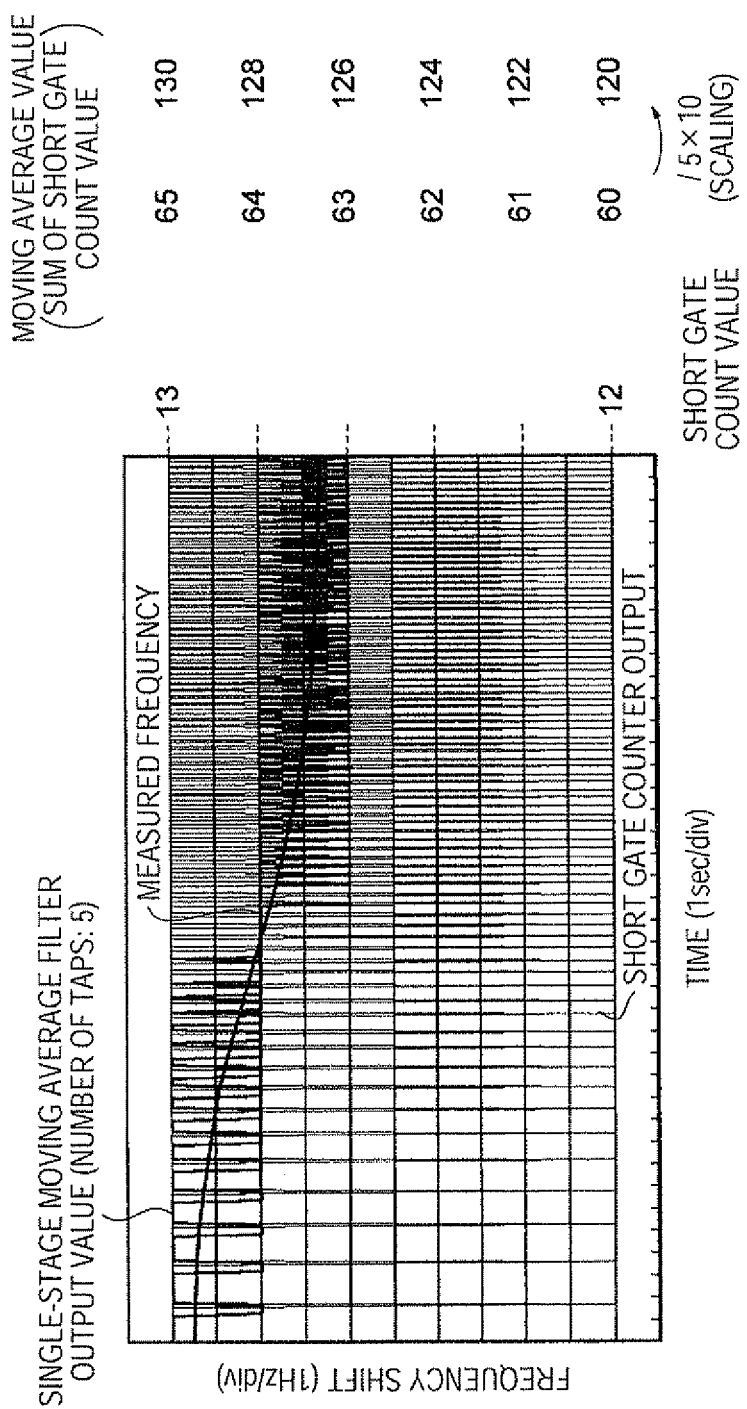
FIG. 16 is an explanatory diagram for explaining correspondence between an output range of the single-stage moving average filter and a count value.
Figure 17:
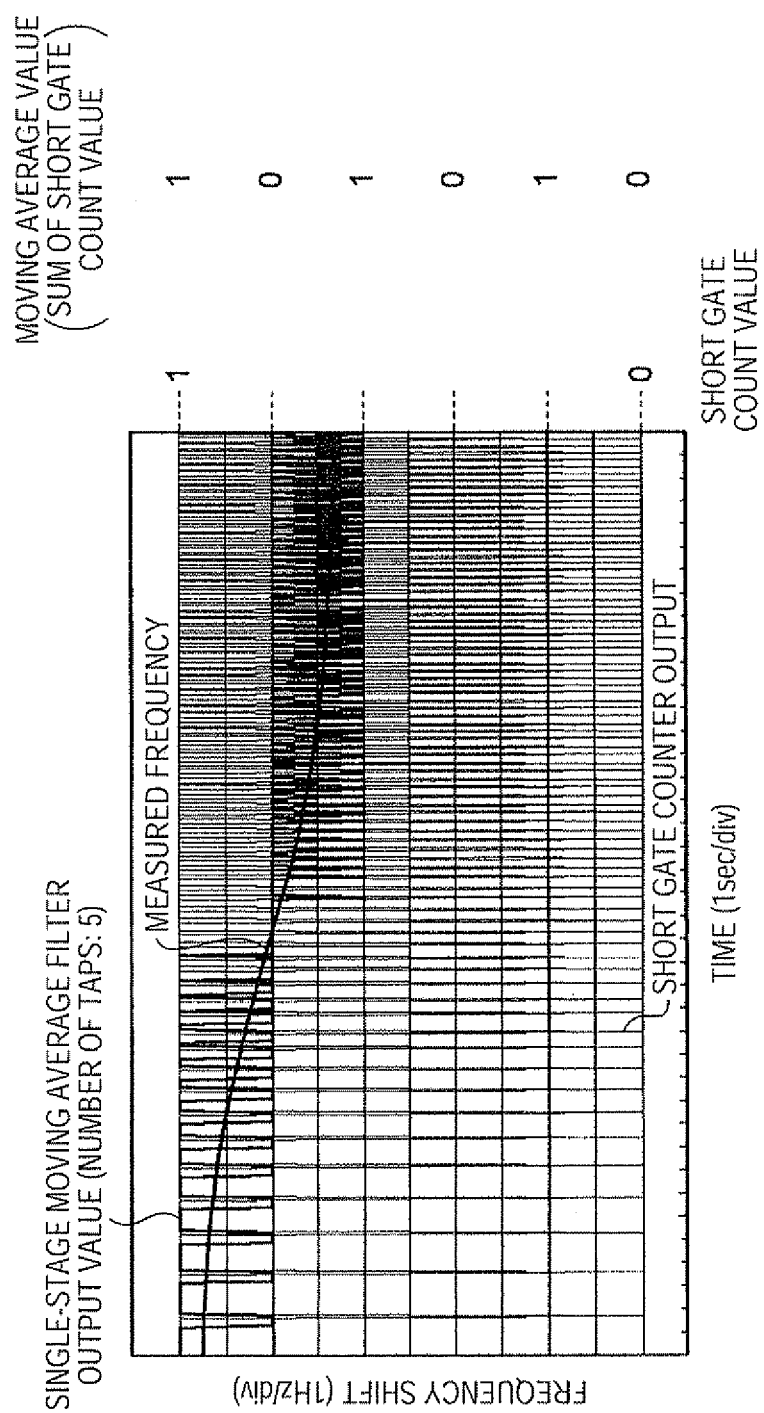
FIG. 17 is an explanatory diagram for explaining correspondence between an even number and an odd number of the output range of the single-stage moving average filter.
Figure 18:
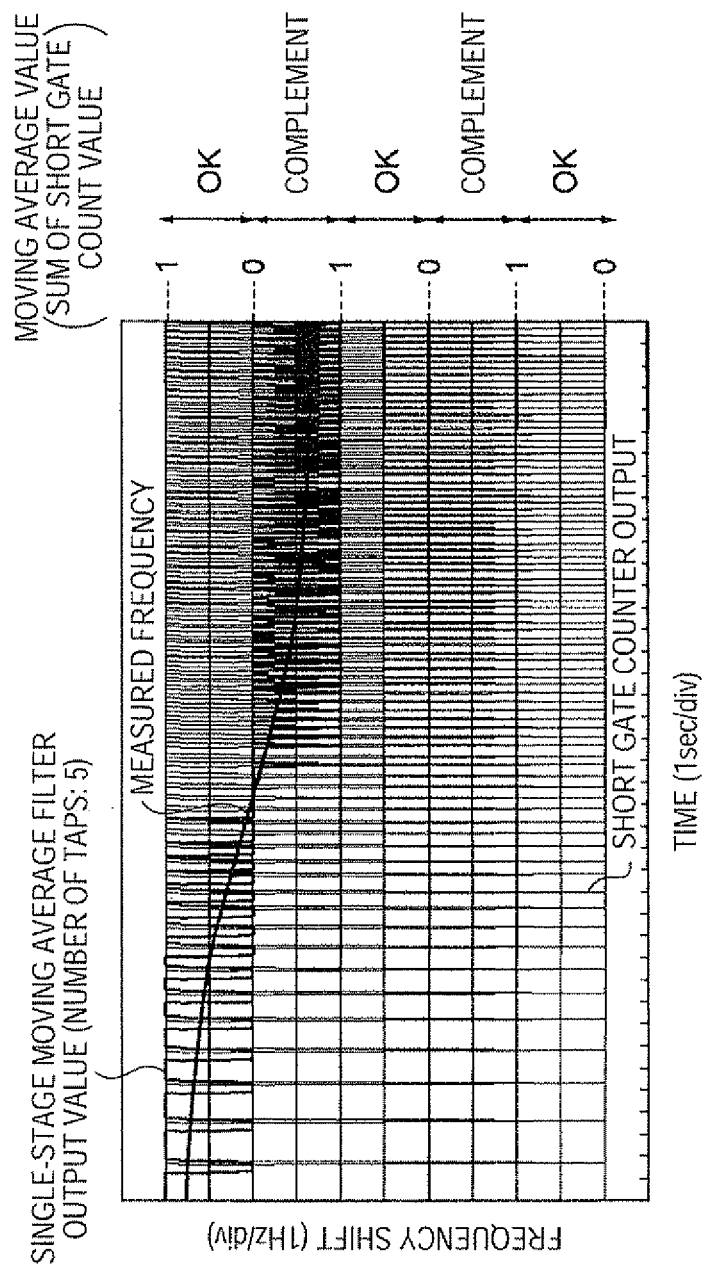
FIG. 18 is an explanatory diagram for explaining correspondence between forward and reverse directions of the count value in the output range of the single-stage moving average filter.

FIGS. 16 through 18 are for explaining other procedures for determining whether or not the binary output of the counter is a complement.

Firstly, FIG. 16 shows an example (the case of treating the count value and the moving average value as an integer) of the short gate count value and the moving average filter output value.

For example, in the case of measuring the input signal varying between 120 Hz and 130 Hz with the gate time of 0.1 second (the sampling frequency of 10 Hz), the short gate count value becomes 12 or 13. Although the moving average is obtained by dividing the sum of the count values in the interval by the number of taps, in the case in which scaling is not considered, it is not required to divide it by the number of taps. If the number of taps is 5, either one of the values from 60 to 65 is output as the moving average value.

FIG. 17 shows an example (the case of treating the count value and the moving average value as a bit stream) of the short gate count value and the moving average filter output value. In the case of treating as a bit stream, the value is replaced with a binary value. Specifically, the values shown on the right side of the graph of FIG. 16 are replaced in such a manner as "13"→"1," "12"→"0," "65"→"1," "64"→"0," . . . "60"→"0."

FIG. 18 shows an example (the case of treating the count value and the moving average value as a bit stream) of the moving average filter output value. On the right side of the graph of the drawing, there are described "OK," "COMPLE-MENT," "OK," . . . "OK" in the respective ranges of the output value of the moving average filter correspondingly to "1," "0," . . . "0" in FIG. 17.

By comparing FIGS. 16 and 18 with each other, whether the magnitude correlation of the output value of the moving average filter corresponds positively to the increase/decrease correlation of the measured frequency or inverted thereto is recognized (the right side column of FIG. 18) based on what range the measured frequency (the right side column of FIG. 16) falls in.

Second Embodiment

Figure 19:
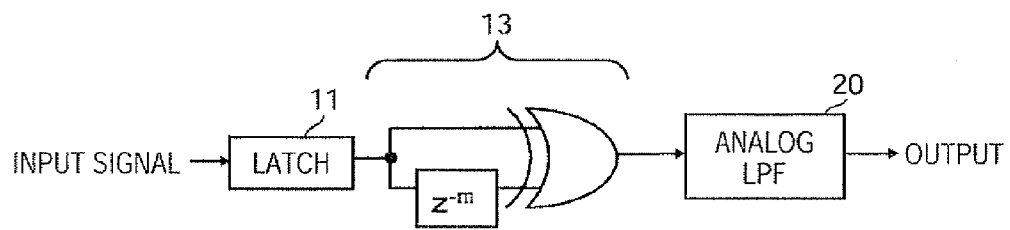
FIG. 19 is a block diagram for explaining an example of a configuration of the short gate counter, the single-stage moving average filter, and an analog filter.

FIG. 19 shows another configuration example of the low pass filter 20. In the present embodiment, an analog level output can be obtained by coupling an analog low pass filter known to the public in the posterior stage of the count/filter section (the function of the 1-bit counter and the moving average filter) 13.

Figure 20:
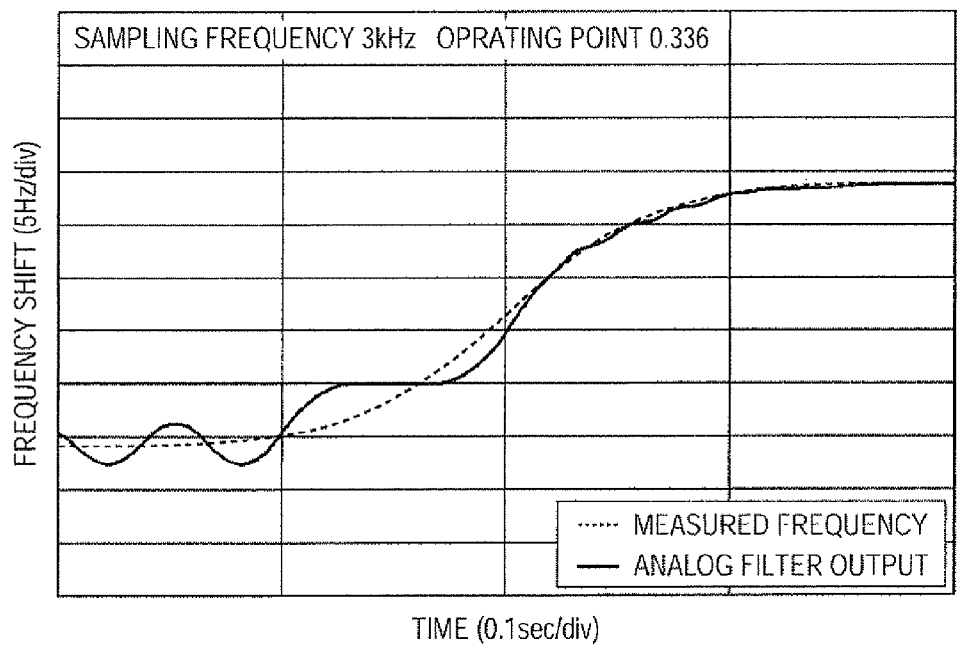
FIG. 20 is a graph showing an output example (an operating point parameter of 0.336) of the short gate counter, the single-stage moving average filter, and the analog filter.

FIG. 20 shows an output example of the analog filter described above in the case of setting the parameters so that the sampling frequency is 3 kHz, and the operating point parameter is around 0.336. In comparison with the input signal, a distortion is observed.

Figure 21:
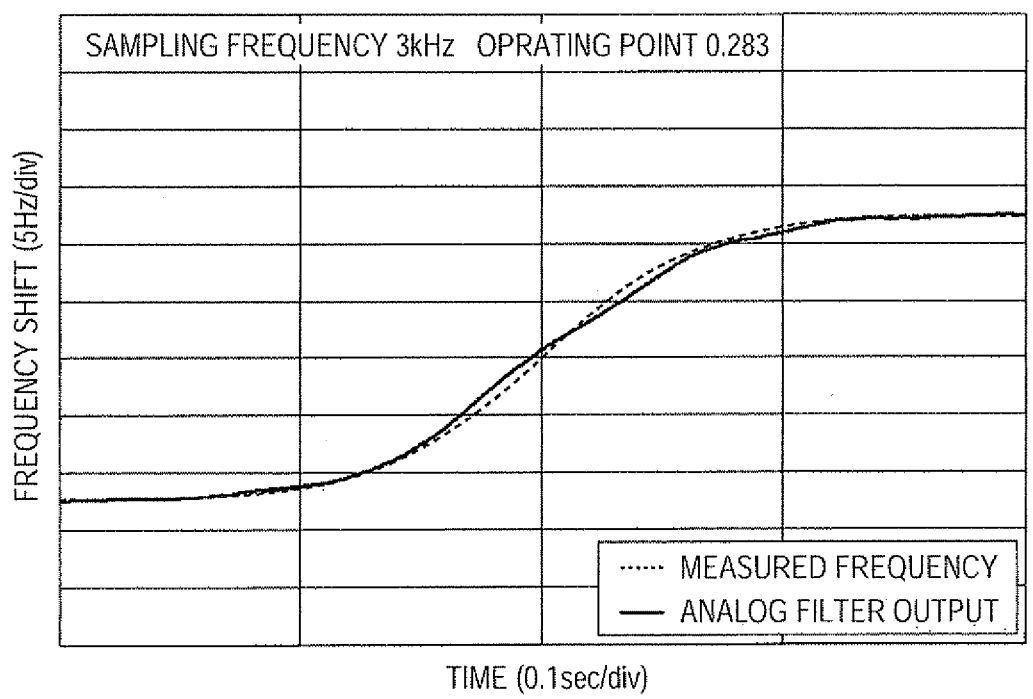
FIG. 21 is a graph showing an output example (an example of adjusting the operating point parameter) of the short gate counter, the single-stage moving average filter, and the analog filter.

FIG. 21 shows an output example of the analog filter described above in the case of setting the operating point parameter to be around 0.283, and other parameters to be the same conditions as in the case of FIG. 20. The output substantially the same as the input signal can be obtained. By comparing FIGS. 20 and 21 with each other, it is recognized that the S/N ratio varies in accordance with the operating point parameter.

Advantages of a hybrid filter using the digital filter (e.g., the moving average filter 21) and the analog filter shown in FIG. 19 described above will be considered.

When performing the filter process in a digital manner, although a high S/N ratio can be assured without deterioration of the information, a memory for retaining the information necessary for the calculation becomes necessary.

In the case of the analog filter, although there is an advantage that the circuit can be simplified because the memory section necessary for the digital filter can be eliminated, since it is required to handle the signal which varies significantly in accordance with the variation of the input signal when using a high sampling frequency, there might arise the case in which some measure needs to be devised for non-linear distortion, and the circuit for correcting the non-linear distortion becomes complicated. Further, if the signal variation is small with respect to the dynamic range, it becomes essentially difficult to assure the high S/N ratio.

In the hybrid filter, there is adopted a configuration of inputting the output of the digital filter to the analog filter. In this case, since the signal varying significantly in two levels is converted into a signal varying in a smaller step size by the digital filter (the moving average filter in this case), there are obtained advantages that the design of the analog filter becomes easy, that a high S/N ratio can be assured, and that the digital filter does not need to have high performance, and therefore, the configuration of the digital filter section becomes easy.

Third Embodiment

Figure 22:
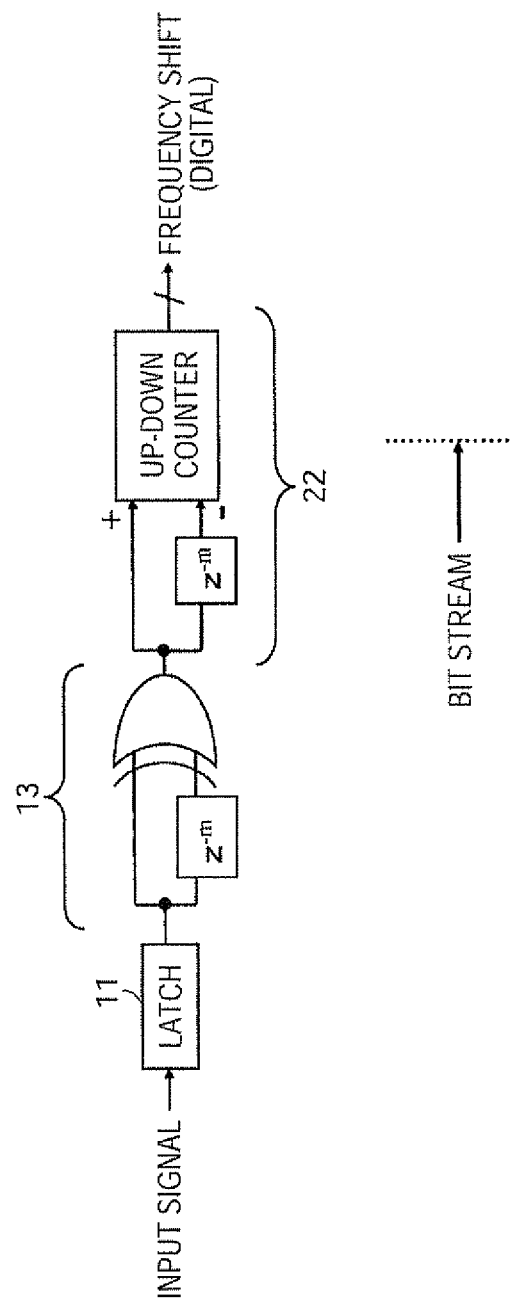
FIG. 22 is a block diagram for explaining an example of a configuration of the short gate counter and a two-stage moving average filter.

FIG. 22 shows an example of disposing a second stage moving average filter 22 using the m-tap shift register $z^{-m}$ and the up-down counter in the posterior stage of the single-stage moving average filter 21 (the count/filter section 13)

described above to thereby obtain the digital output with a dual-stage moving average filter configuration. The signal is transmitted to the up-down counter as a bit stream, and is output from the up-down counter as an output of a plurality of bits. The digital output becomes to have Int($\log_2$ m+1) bits.

Figure 23:
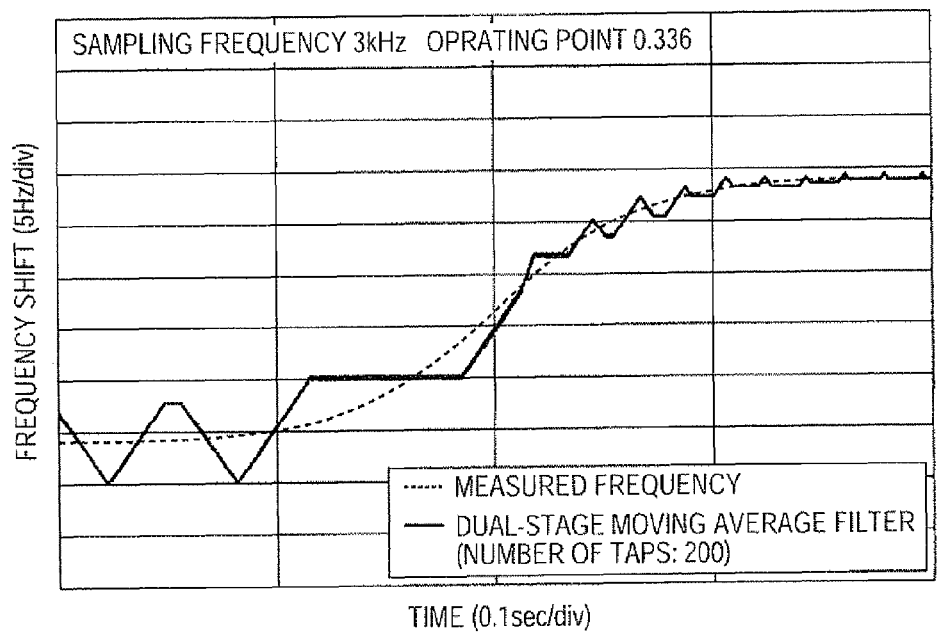
FIG. 23 is a graph showing an output example (an operating point parameter of 0.336) of the short gate counter and the two-stage moving average filter.

FIG. 23 shows an output example of the digital filter in the case in which the sampling frequency is set to be 3 kHz, the operating point parameter is set to be 0.336, and the number of taps of the dual-stage moving average filter is set to be 200. It is recognized that the level of the noise is larger compared to the input signal.

Figure 24:
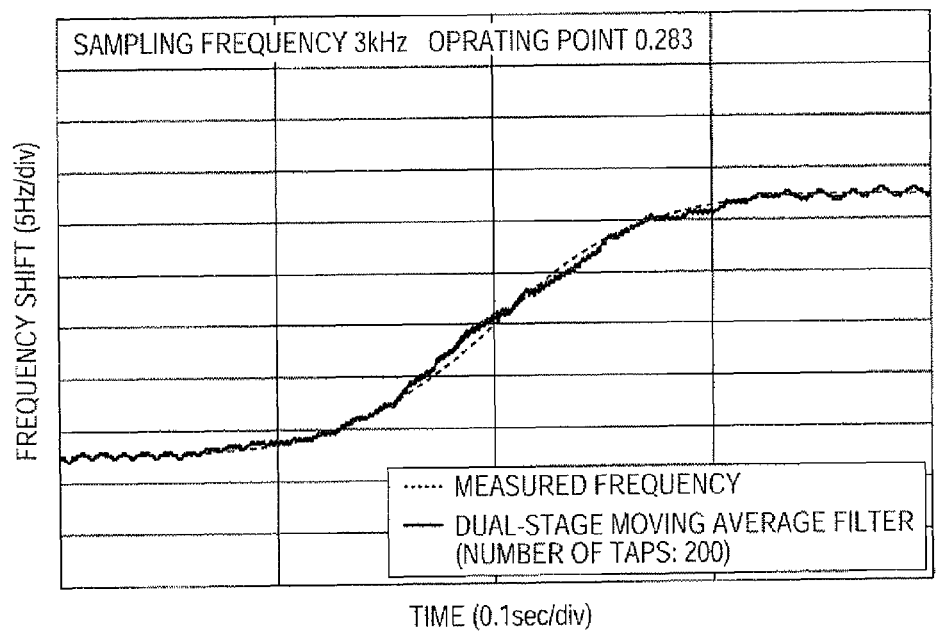
FIG. 24 is a graph showing an output example (an example of adjusting the operating point parameter) of the short gate counter and the two-stage moving average filter.

FIG. 24 shows an output example of the digital filter in the case in which the operating point parameter is set to be 0.283, and the other conditions are set to be the same. It is recognized that the noise is reduced. As described above, it is understood that the S/N ratio varies depending on the selection of the operating point parameter.

Figure 25:
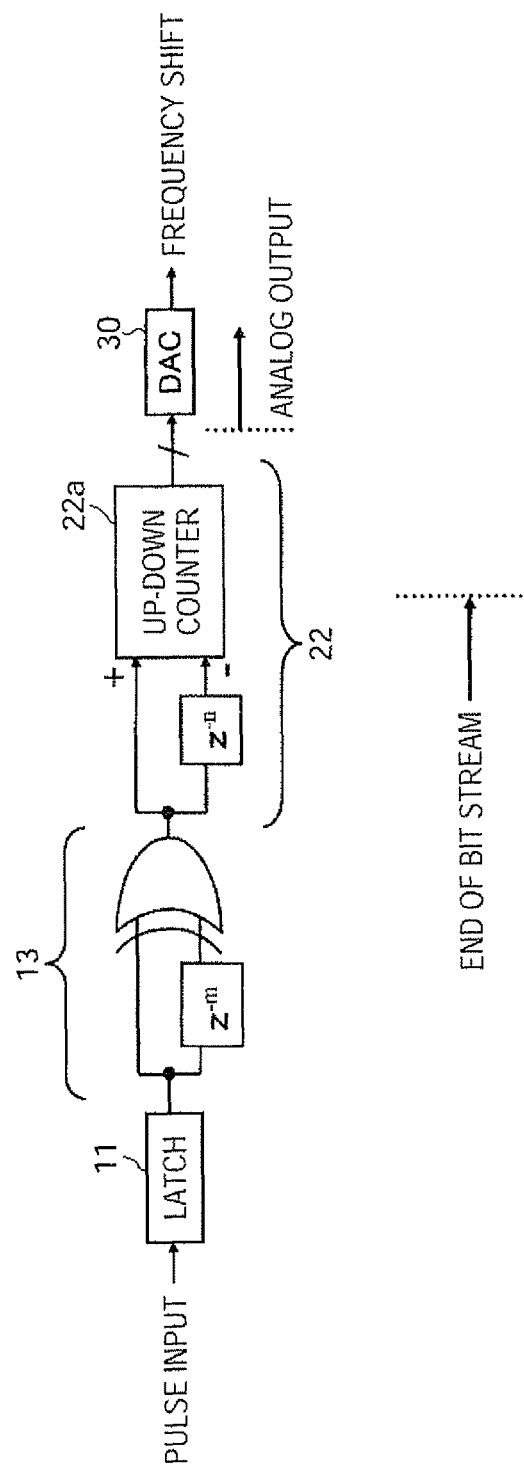
FIG. 25 is a block diagram showing an example of configuring the second stage moving average filter of a low pass filter section using an up-down counter.

FIG. 25 shows a circuit configuration example in the case in which the analog output needs to be obtained in the configuration shown in FIG. 22. As shown in the drawing, a D/A converter 30 is coupled to the output of the up-down counter 22a of the second stage moving average filter, thereby obtaining the frequency shift of the analog output.

Fourth Embodiment

In the embodiment described above, the count/filter section 13 with a simplified circuit configuration is configured by combining the 1-bit counter 12 (the short gate time counter section 10) and the moving average filter 21 (the low pass filter section 20). Further, it is preferable that the moving average filter 22, 23 on and after the second stage of the low pass filter described above can also be simplified (see FIGS. 2A to 2H).

Since the detection band of the frequency shift is in a low frequency range compared to the sampling frequency in the embodiment, all of the output values of the second stage moving average filter are not necessarily required. In other words, depending on the required specifications, in some cases, discrete output values of the second stage moving average filter are sufficient.

Here, since the value obtained by counting the output of the first stage moving average filter in a certain period (n clock period) is equivalent to an instantaneous value of the output of the second stage moving average filter (n taps), the up counter can be adopted if the discrete outputs are sufficient. As described later, since the interval is allowed to occur in the count on this occasion, an asynchronous up counter, which is the simplest as a counter, can be adopted, and if low power consumption has a priority, a Gray counter can be adopted. In either case, the circuit configuration is made simpler and easier compared to the up-down counter 22a shown in FIG. 25.

On the other hand, if the configuration of providing the up counter without interval is adopted, a noise shaping can be made to function, and therefore, accuracy of the output value of the third stage moving average filter can be improved. This is effective particularly for the case of performing the filter processing further on the output of the dual-stage moving average filter obtained here in the posterior stage.

Figure 26:
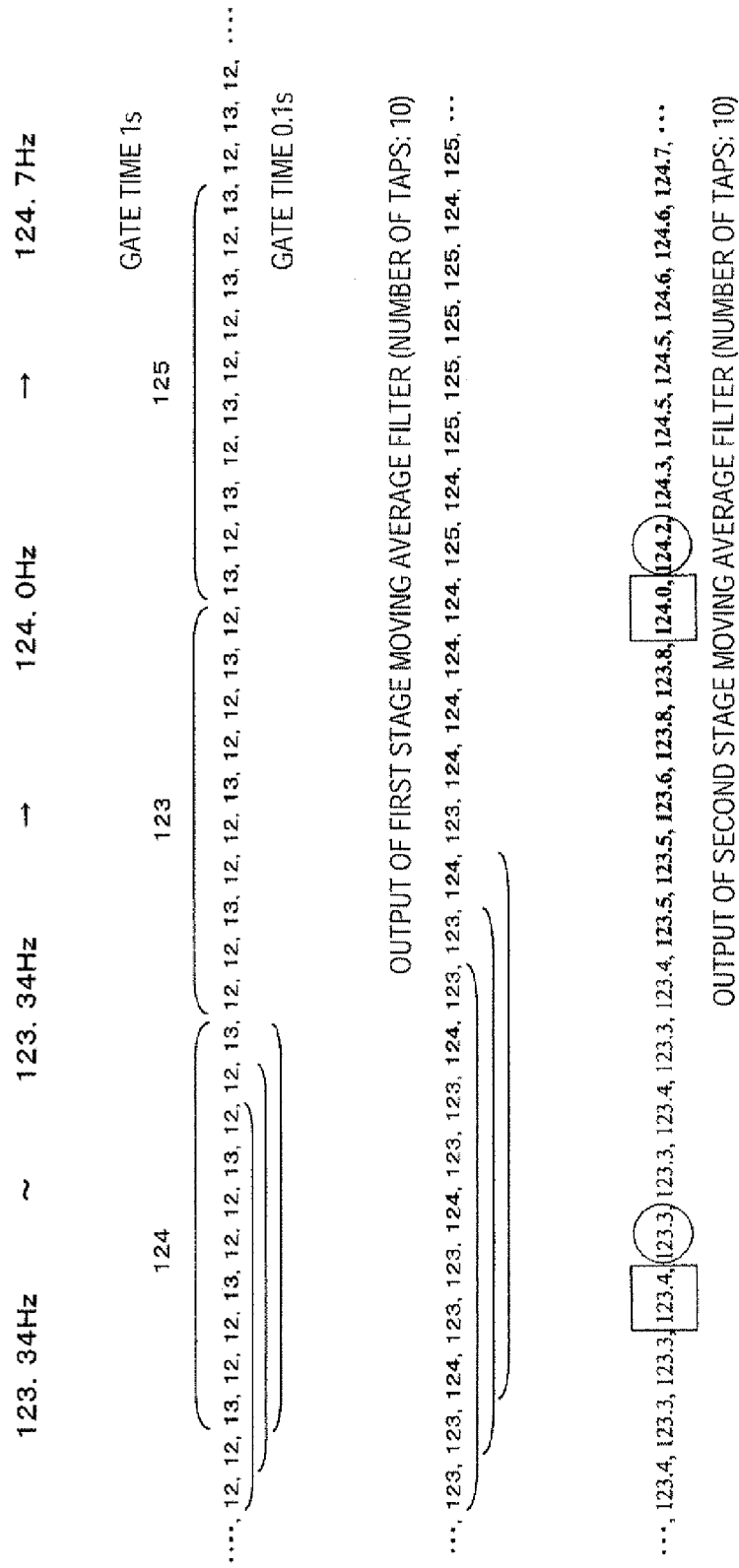
FIG. 26 is an explanatory diagram for explaining an output example of the two-stage moving average filter of the low pass filter section.
Figure 27:
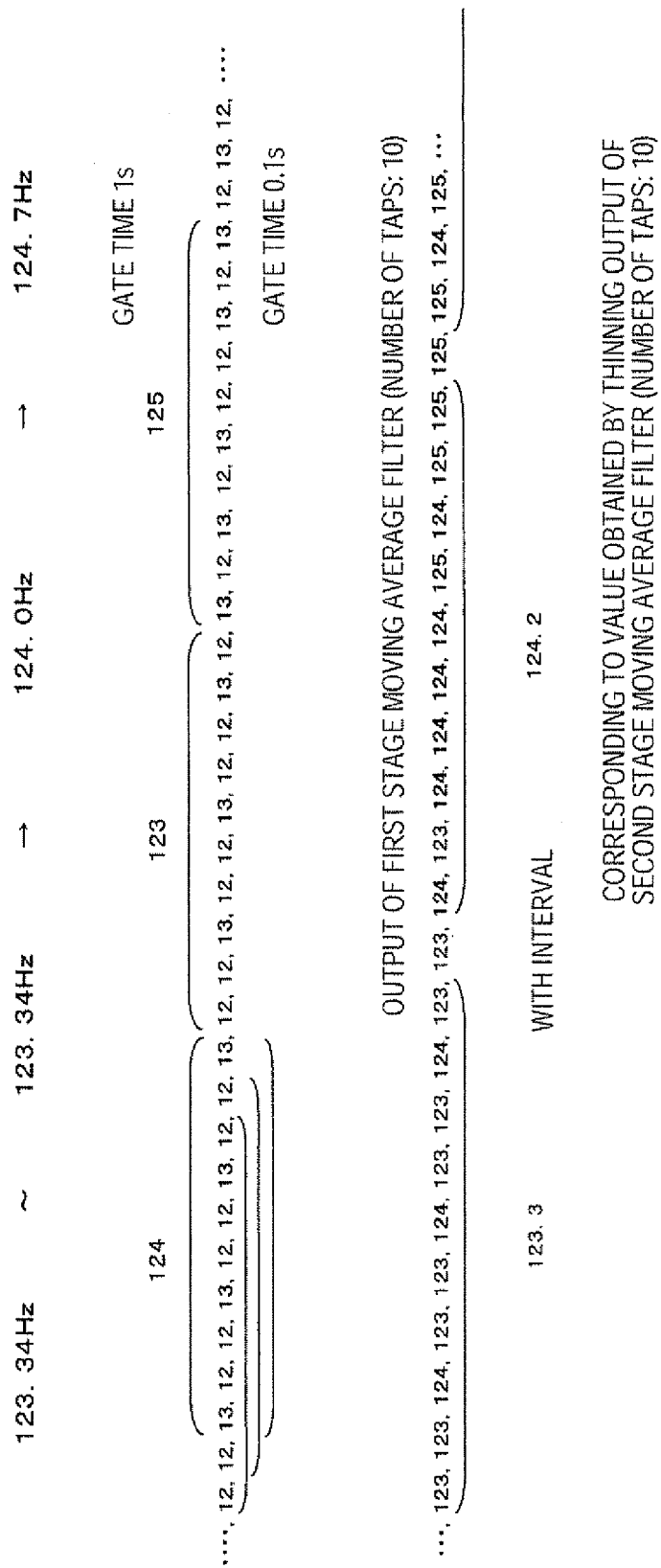
FIG. 27 is an explanatory diagram for explaining an output example (an interval average value) of the two-stage moving average filter in the case in which an interval exists.
Figure 28:
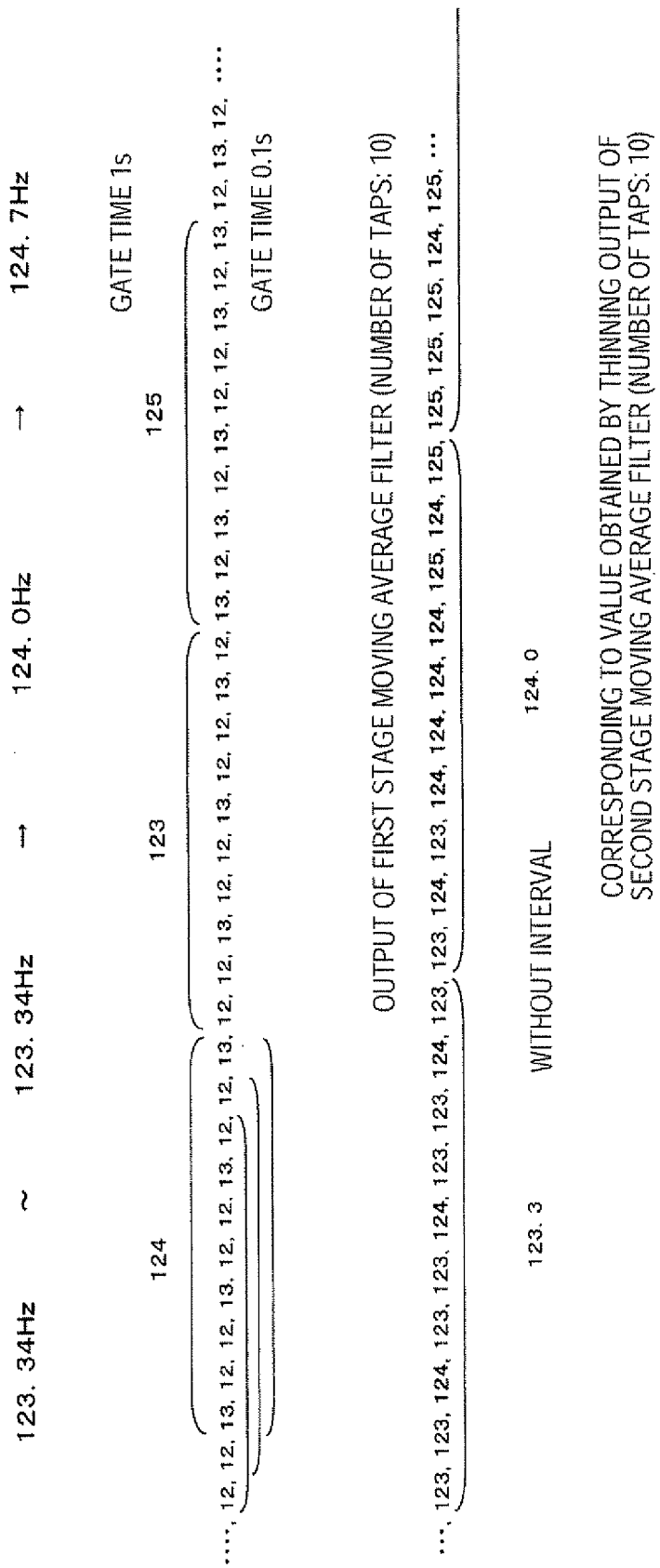
FIG. 28 is an explanatory diagram for explaining an output example (the interval average value) of the two-stage moving average filter in the case in which no interval exists.

FIGS. 26 through 28 are explanatory diagrams for explaining simplification of the configuration of the second stage moving average filter 22. In the short gate time count method, a counter without interval is used as the short gate time counter 10. The interval denotes the period, in which it fails to measure the input signal, such as a reset period of a counter. The counter without interval can be realized by, for example, alternately operating two counters having the counting period and the reset period shifted from each other (see JP-A-2009-250807 described above).

As a result of various investigations, it has been found out that although the operation without interval is necessary in the short gate time counter and the first stage moving average filter, in the moving average filters on and after the second stage presence of the interval has little influence on the output characteristic. It is conceivable that this is because the first stage (the previous stage) moving average filter decreases the high-frequency component in the output, and therefore, in the second stage (the posterior stage) moving average filter dropping of the sampling frequency has little influence. By utilizing such a tendency, the low pass filter circuit can be configured more easily and simply.

FIG. 26 is an explanatory diagram for schematically explaining the output relationship of the multi-stage (dual-stage) moving average filter constituting the low pass filter section 20. It should be noted that for the sake of convenience of explanation the output is expressed by decimal numbers.

In this example, it is assumed that the frequency of the pulse train signal to be an object of the measurement gradually varies from the state of keeping 123.34 Hz to 124.7 Hz. Firstly, when sampling it with the gate time of 0.1 second, the count value of 12 or 13 is transmitted from the counter 10 at a certain rate. Three groups each representing a total of 10 data become 124, 123, 125, respectively, and the values move toward 124.7 Hz. Here, 10 count values (the number of taps is 10) taking 12 or 13 are taken as the object of the moving average calculation (the first stage moving average). It is recognized from the first stage moving average values that appearance of the data with increased numerical value becomes more frequent as the position moves rightward. Further, when performing the calculation of the second stage moving average (the number of taps is 10) using the first stage moving average values as the input, this tendency is emphasized, and the accuracy is also improved. Using multiple stages of moving average filters corresponds to steepening the attenuation slope representing the characteristic of the low pass filter, and at the same time, to removing the high-frequency component from the frequency spectrum of the pulse train composed of 12 and 13.

FIG. 27 shows an example of the case in which the interval exists in the average value calculation process of a certain interval when counting the output of the first stage moving average filter in the second stage moving average filter. By comparing FIGS. 26 and 27, it is recognized that the count value in a certain interval is equivalent to the value (the average output value in the case of reducing the number of times of average value output) obtained by thinning the output value of the moving average filter.

FIG. 28 shows an example of the case in which no interval exists when counting (performing interval average value calculation) the output of the first stage moving average filter in the second stage moving average filter. Similarly to the case of FIG. 27, it is equivalent to the value obtained by thinning the output value of the moving average filter. It is recognized that if the object is to obtain the output value of the dual-stage moving average filter at intervals, presence or absence of the interval in the counter for obtaining the value has no relation to the accuracy of the value thus obtained (because the timing for thinning is only shifted). Therefore, the counter with the interval can be used. As described later, the up counter, which has a simple configuration and achieves a fast operation, but has the interval, can be used. The up counter can be an asynchronous counter. Further, the up counter can be a Gray counter or the like.

It should be noted that in the case of obtaining the output value of the dual-stage moving average filter at intervals and then performing a further signal processing (e.g., the third stage moving average filter), presence or absence of the interval might have an influence on the result. Further, if the interval exists, the noise shaping effect (the effect of improving the S/N ratio by sampling (digitalizing) the input signal at a high frequency to thereby disperse the low frequency noise in a wide band) becomes unavailable, and therefore, thinning of the output value is selected appropriately in accordance with the purpose.

Figure 29:
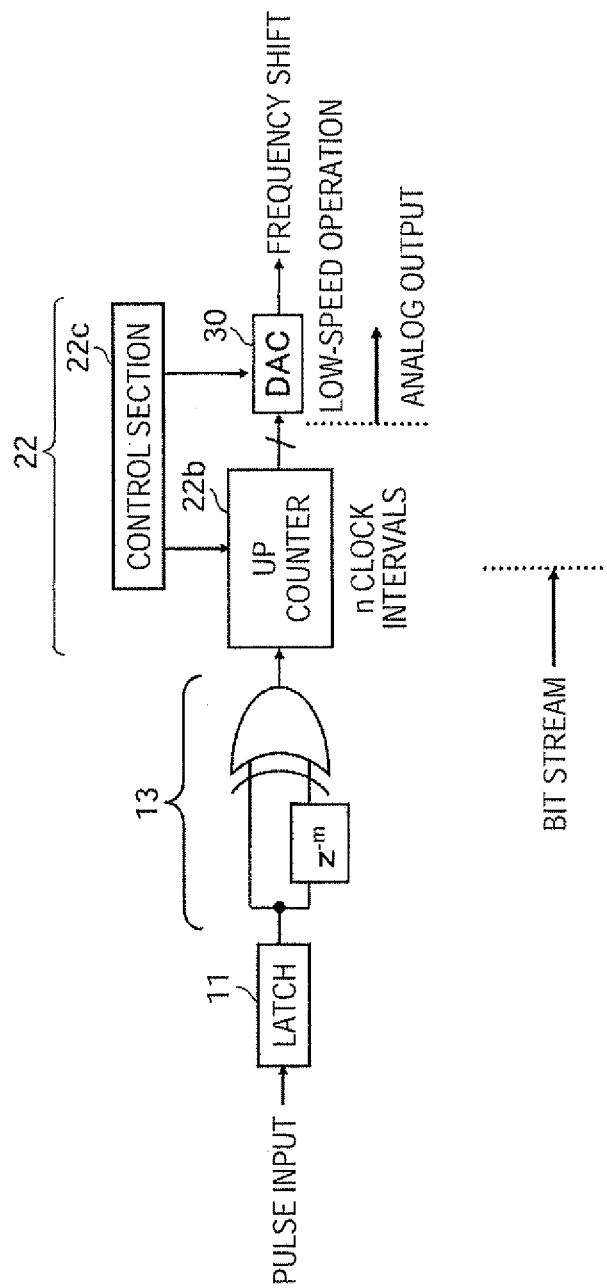
FIG. 29 is a block diagram showing an example of configuring the second stage moving average filter using an up counter.

FIG. 29 shows a modified example of the second stage moving average filter 22 configured based on the findings described above. In this example, the n-stage shift register $z^{-n}$ and the up-down counter 22a of the moving average filter 22 shown in FIG. 25 are constituted with an up counter 22b and a control section 22c. Further, the operation timing of the D/A converter 30 is controlled by the control section 22c. The control section 22c makes the up counter 22b hold the count values input thereto in the n clock intervals and output them to the D/A converter 30. Subsequently, the control section 22c resets the up counter 22b.

Figures 30A, 30B:
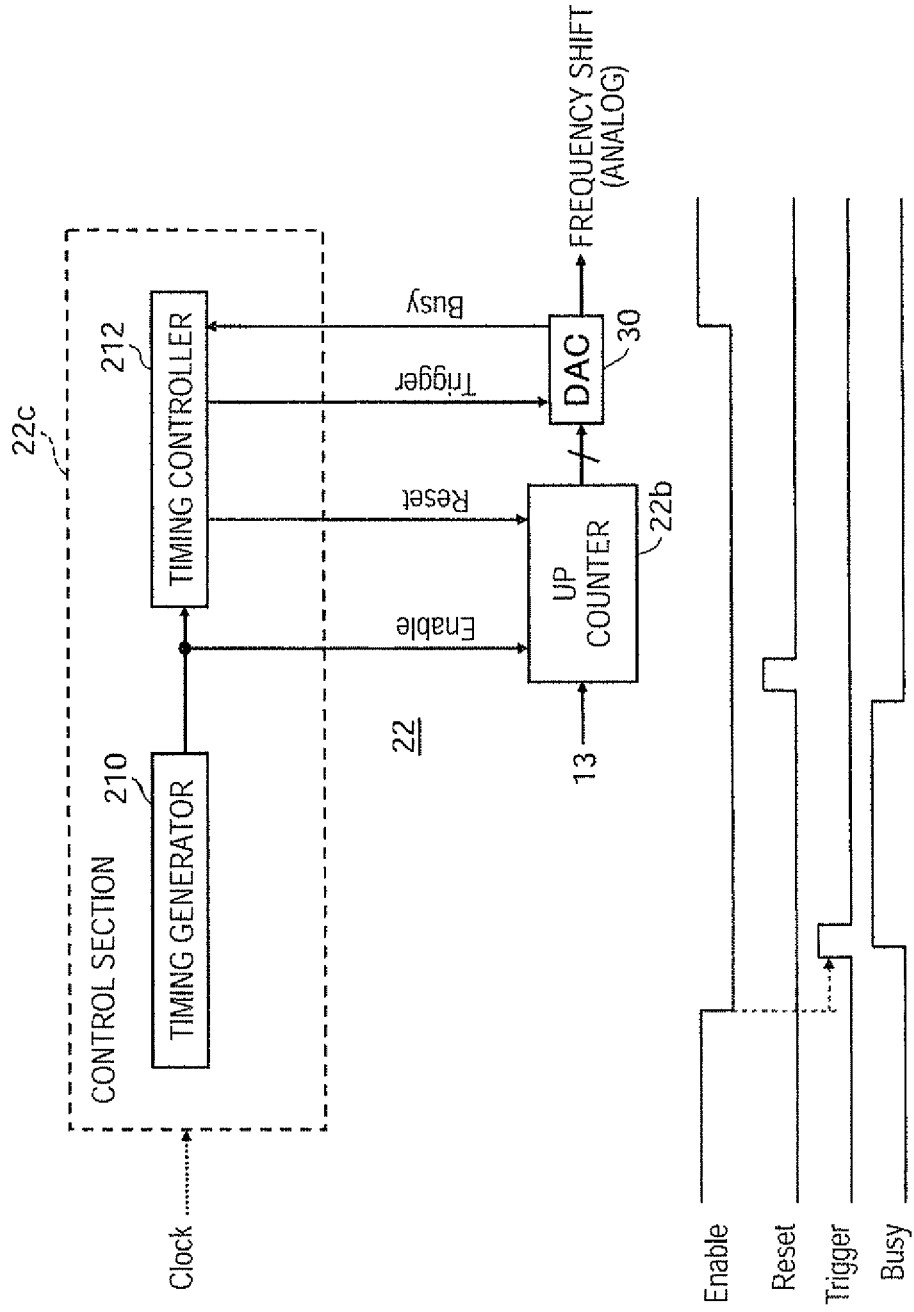
FIGS. 30A and 30B are explanatory diagrams for explaining a configuration example of a control section shown in FIG. 29.

FIGS. 30A and 30B are for explaining the operation of the control section 22c, and as shown in FIG. 30A, the function of the control section 22c is configured with a timing generator 210 and a timing controller 212. It should be noted that substantially the same control can also be performed by a microcomputer. FIG. 30B is a timing chart of various control signals output from the timing generator 210 and the timing controller 212.

The up counter 22b performs counting-up in sync with the clock if the input signal is in the high level when the Enable signal is in the high level. The up counter 22b retains the count value while the Enable signal is in the low level. When the Reset signal is input, the up counter 22b resets the count value. The D/A converter 30 sets the Busy signal to the high level in response to input of the Trigger signal, and then reads out the count value. The up counter 22b outputs an analog value corresponding to the count value, and then sets the Busy signal to the low level. The timing generator 210 generates a signal (the Enable signal) for defining the counting period of the up counter 22b. The timing generator 210 outputs the high level for the time corresponding to n clock intervals. The timing generator 210 can be configured with, for example, a clock frequency divider circuit. When the Enable signal of the timing generator becomes in the low level, the timing controller 212 outputs the Trigger signal after a predetermined setting time (the time period enough for validating the count value) has elapsed. In response to the Busy signal from the D/A converter switching from the high level to the low level, the timing controller 212 outputs the Reset signal (the configuration of eliminating the Busy line, and outputting the Reset signal after a predetermined time has elapsed from the output of the Trigger signal can also be adopted). By repeating the operation described above, counting by the up counter 22b is performed.

Fifth Embodiment

Figure 31:
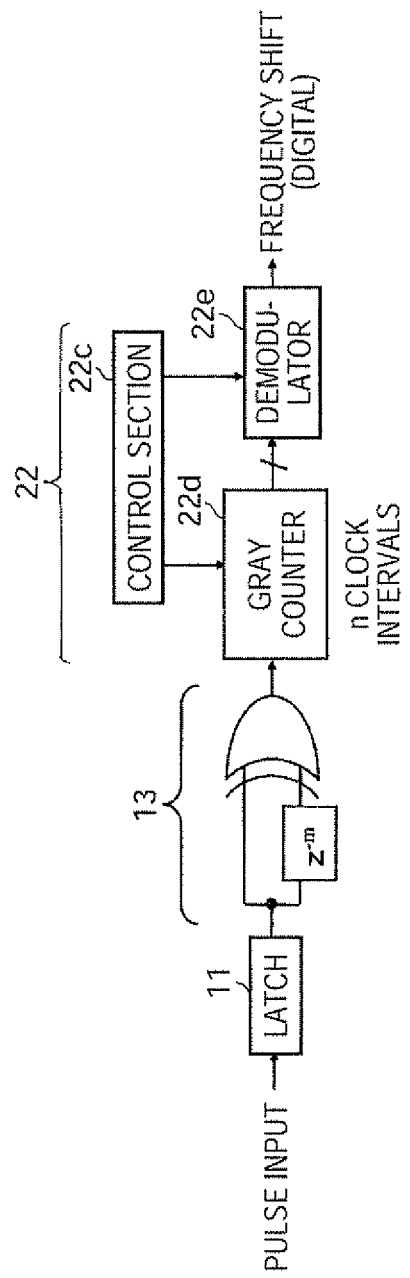
FIG. 31 is a block diagram showing an example of configuring the second stage moving average filter using a Gray counter.

FIG. 31 shows an example of using a Gray counter 22d as a substitute for the moving average filter 22 described above. The Gray counter is a counter having bit change in the output signal always restricted to 1 bit. Therefore, the Gray counter 22d has an advantage of small power consumption. The retained value of the Gray code counter (the Gray counter) is returned to the count value by the demodulator 22e. The Gray code counter (the Gray counter) 22d and the demodulator 22e are controlled in the operation by the control section 22c.

Figure 32:
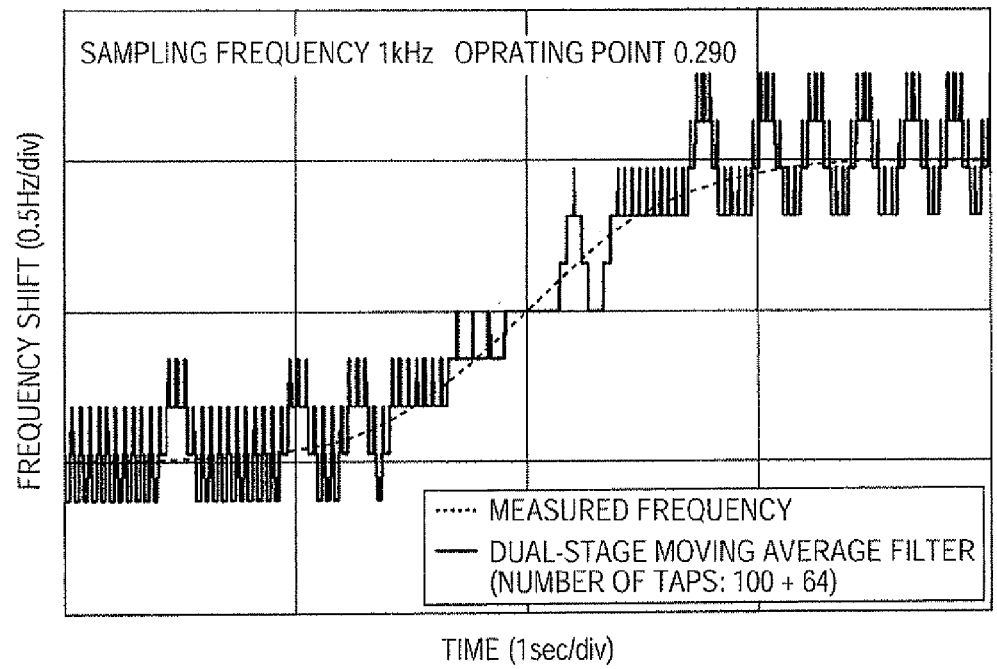
FIG. 32 is a graph showing an output example of the case in which the two-stage moving average filter is used as the low pass filter.

FIG. 32 shows a comparative example (FIG. 24) of the short gate time counter using the dual-stage moving average filter (the number of taps of the first stage is 100, the number of taps of the second stage is 64). The sampling frequency is set to be 1 kHz, and the operating point parameter is set to be 0.290.

Figure 33:
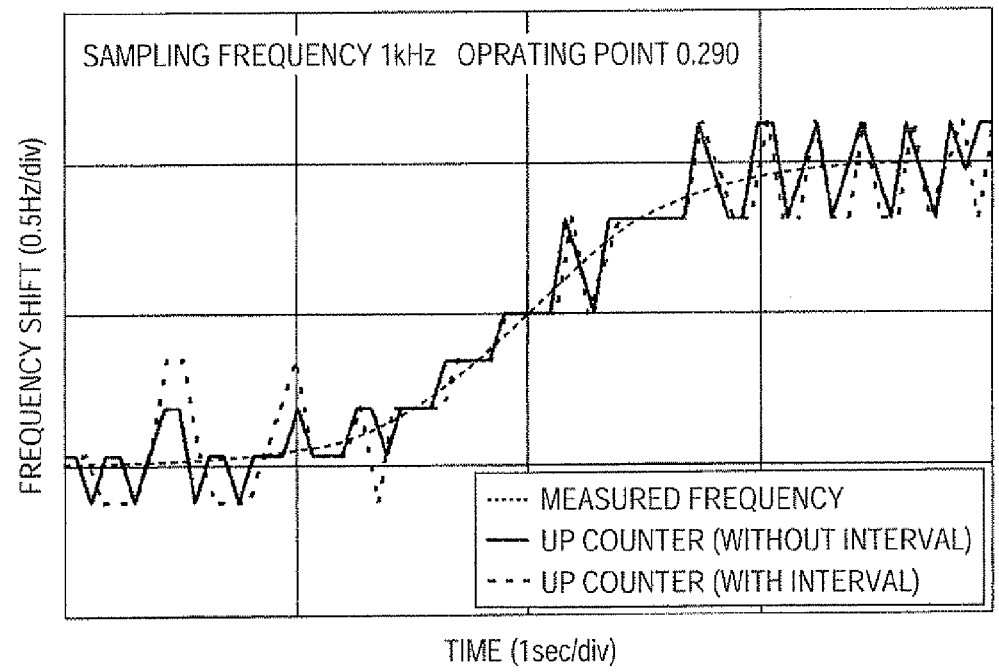
FIG. 33 is a graph showing an output example of the case in which thinning is performed by the second stage moving average filter of the embodiment.

FIG. 33 shows an example using the Gray counter 22d as the second stage moving average filter. The sampling frequency is set to be 1 kHz, and the operating point parameter is set to be 0.290. The thin dot line in the drawing represents the input signal, the thick solid line represents an example "without interval" described above, and the thick dot line represents an example "with an interval" described above. The power consumption is reduced compared to the comparative example (FIG. 22) of the dual-stage moving average filter. The S/N ratio is in substantially the same level as in the comparative example irrespective of presence or absence of the interval.

It should be noted that when comparing the Gray counter and the subsequent asynchronous counter, the power consumption of the counter section with the Gray counter is smaller, and is suppressed to be about a third thereof.

Sixth Embodiment

Figure 34:
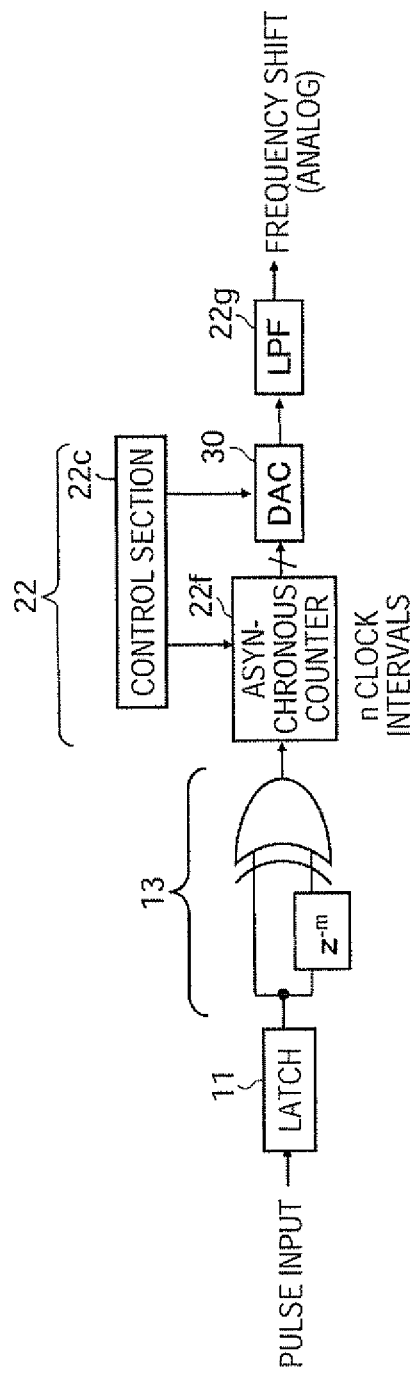
FIG. 34 is a block diagram showing an example of configuring the second stage moving average filter using an asynchronous counter.

FIG. 34 shows an example of using an asynchronous counter 22f as a substitute for the up-down counter 22a of the second stage moving average filter described above. Further, the output of the D/A converter 30 is output via an analog low pass filter 22g, thereby outputting an analog frequency shift. The asynchronous counter 22f has an output varying in response to the input in contrast to a synchronous counter having an output of each digit varying at a time in sync with the clock signal. The asynchronous counter 22f has an advantage that the circuit configuration is simpler than that of the synchronous counter.

Figure 35:
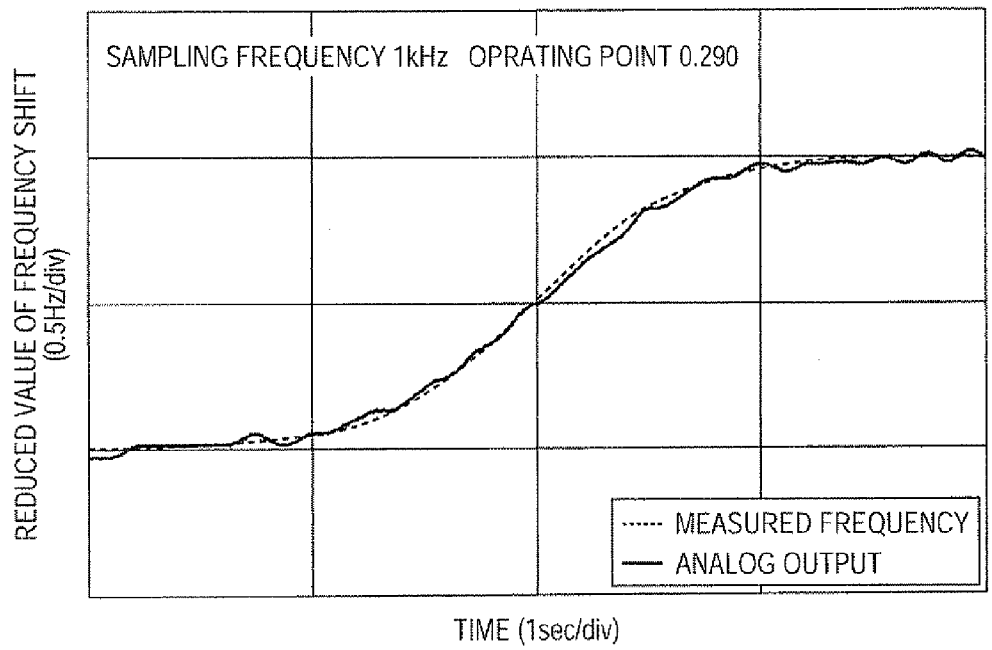
FIG. 35 is a graph showing an example of a measured frequency and an analog output (without interval) in the configuration shown in FIG. 34.

FIG. 35 shows an example (without interval) of the analog output from the low pass filter 22g having the configuration shown in FIG. 34 and the measured frequency. The sampling frequency is set to be 1 kHz, the operating point parameter is set to be 0.290, and the counting period of the up counter is set to be 64 intervals.

Figure 36:
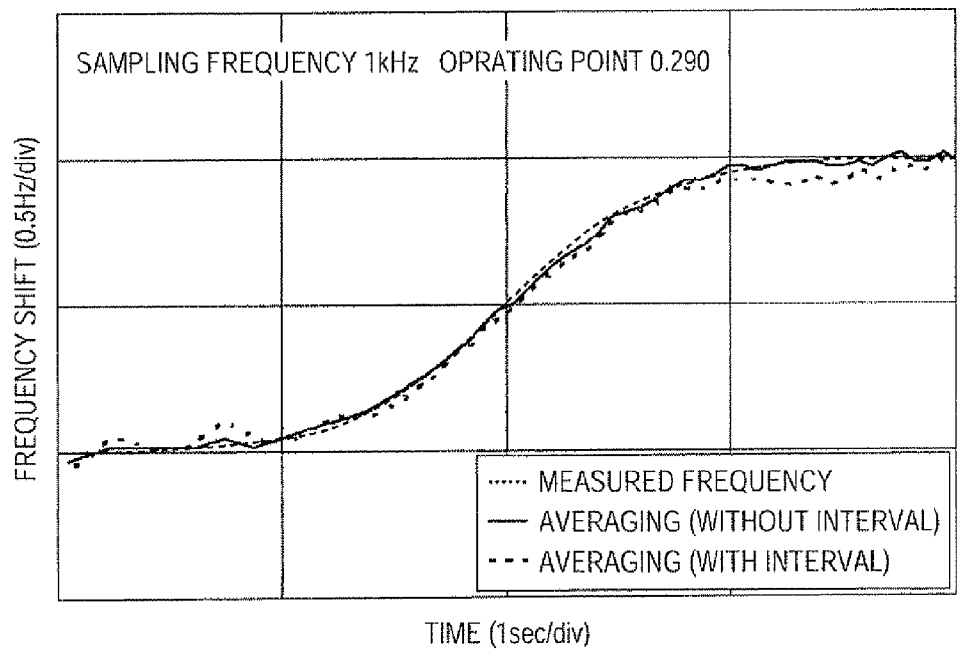
FIG. 36 is a graph showing an example of the measured frequency and the analog output (without interval, with an interval) in the configuration shown in FIG. 34.

FIG. 36 shows an example (the thick dot line) of providing the interval corresponding to 6 intervals (10%) to the example (the thick solid line) without interval shown in FIG. 35. In the output result under the condition of "no interval" the advantageous effect of noise shaping can be confirmed.

In the frequency measuring apparatus of each of the embodiments described above, the polarity of the frequency measurement output is appropriately corrected by, for example, determining the correspondence between increase/decrease of the input signal frequency described above and increase/decrease of the output level.

As described hereinabove, according to the embodiment of the invention, since there is used the configuration including the short gate counter section and the single-stage moving average filter section corresponding to the bit stream (the binary signal), the circuit configuration can be simplified compared to the case of not corresponding to the bit stream, thus the high-speed operation can be achieved. Further, the measurement resolution is improved due to the high-speed operation, and the power consumption can be suppressed by simplifying the circuit configuration.

Further, the configuration of the short gate counter section and the single-stage moving average filter section made to correspond to the bit stream is simplified by the equivalent circuit, the circuit area is reduced, and the suppressing of the power consumption is achieved.

Further, in the configuration of the short gate counter section and the single-stage moving average filter section, the binary output can be obtained by appropriately selecting the sampling frequency and the number of taps (by appropriately selecting the dynamic range), thus the signal in the present configuration can be changed to a bit stream. Further, by appropriately selecting the operating point parameter, the influence of the pattern noise caused when changing the signal to the bit stream can be reduced.

Further, by adopting the configuration including the short gate counter section, the single-stage moving average filter section, and the analog filter section, a high-resolution analog output can be obtained using a simple configuration.

Further, by adopting the configuration including the short gate counter section, the single-stage moving average filter section, and the up-down counter, a dual-stage moving average filter output (a digital output) can be obtained using a simple configuration.

Further, by adopting the configuration including the short gate counter section, the single-stage moving average filter section, and the up counter made to correspond to a bit stream, the configuration can easily be obtained compared to the configuration including "the short gate count and the dual-stage moving average filter."

As the up counter described above, an asynchronous counter and a Gray counter can be used. The asynchronous counter has the easiest circuit of all of the up counters. The Gray counter changes at most 1 bit every count operation, and therefore, low power consumption can be achieved.

It is possible to obtain an analog output using a D/A converter in addition to the configuration described above. Thus, the high-resolution analog output can be obtained using a simple configuration. Since a lower sampling rate is sufficient, the performance required for the D/A converter can be lowered.

The interval is allowed when counting the input pulse train signal. When providing the interval, the counter circuit can be reset, and the circuit configuration can be simplified.

In the case of providing no interval when counting the input pulse train signal, the noise shaping by the short gate time count can be made to function, and therefore, the accuracy of the output value of the second stage moving average filter can be improved. This is effective particularly for the case of performing the filter processing further on the output of the dual-stage moving average filter obtained here in the posterior stage.

Since the frequency measuring apparatus described above has a small circuit size, and is easily mounted, it is possible to make the apparatus smaller in size, higher in accuracy, lighter in weight, and lower in cost. The frequency measuring apparatus described above is suitable for making various sensors using a quartz crystal smaller in size and higher in resolution, for example. The frequency measuring apparatus described above is suitable for making various sensors using a quartz crystal be integrated or formed as a platform. The frequency measuring apparatus described above is preferably used for an odor sensor, a gas sensor, a transducer array for a biosensor, a QCM device, and so on.

According to the frequency measuring apparatus related to the aspects of the invention provided with the short gate time counter section and the low pass filter section and for measuring the frequency of the pulse train signal, the low pass filter section is formed by a moving average filter having a multi-stage configuration, and the operation frequency of the filter in the second stage (the posterior stage) is lower than the operation frequency of the moving average filter in the first stage (the anterior stage) (an intermittent operation). Since the high-frequency component in the output of the filter is reduced by the first stage moving average filter, degradation of filter performance is little even if the sampling frequency (operation frequency) of the filter in the posterior stage is lowered. By setting the frequency of the output operation of the filter in the second stage (the posterior stage) to be lower than the frequency of the output operation of the filter in the first stage (the anterior stage), it becomes possible to make the circuit simpler and lower in power consumption.

What is claimed is:

1. A frequency measuring apparatus comprising:
    a counter section adapted to count a signal including a pulse signal for a predetermined time period, and output a binary count value corresponding to a frequency of the signal including the pulse signal; and
    a low pass filter section adapted to perform a filtering process of the binary count value,
    wherein the low pass filter section includes a first stage filter and a second stage filter,
    the first stage filter is a moving average filter to which the count value is input, the first stage filter reduces a high frequency component, the first stage filter outputs a binary output, and
    the second stage filter performs an average value calculation of the binary output to reduce the high frequency component of the binary output, the second stage filter outputs an output.

2. The frequency measuring apparatus according to claim 1, wherein
    an output operation frequency of the second stage filter is lower than an operation frequency of the first stage filter.

3. The frequency measuring apparatus according to claim 1, wherein
    the second stage filter is a moving average filter.

4. The frequency measuring apparatus according to claim 1, wherein
    the second stage filter includes an up counter adapted to calculate an interval average value.

5. The frequency measuring apparatus according to claim 4, wherein
    the up counter includes one of an asynchronous counter and a Gray code counter.

6. The frequency measuring apparatus according to claim 1, wherein
    a part of the counter section and the first stage moving average filter are mainly composed of a latch circuit, a shift register circuit, and an exclusive OR circuit.

7. The frequency measuring apparatus according to claim 1, further comprising:
    an inversion/noninversion control section disposed between an output end of the counter section and an output end of the low pass filter section, and adapted to perform one of inversion and noninversion on a train of binary outputs in accordance with an inversion instruction supplied.

8. The frequency measuring apparatus according to claim 1, further comprising:
    one or more stages of moving average filters disposed in a posterior stage of the second stage filter.

9. The frequency measuring apparatus according to claim 1, further comprising:
    a D/A converter section disposed in a posterior stage of the second stage moving average filter.

* * * * *